(12) United States Patent
Schenk et al.

(10) Patent No.: US 9,093,271 B2
(45) Date of Patent: Jul. 28, 2015

(54) METHOD FOR MANUFACTURING A THICK EPITAXIAL LAYER OF GALLIUM NITRIDE ON A SILICON OR SIMILAR SUBSTRATE AND LAYER OBTAINED USING SAID METHOD

(75) Inventors: David Schenk, Bernin (FR); Alexis Bavard, Limeil Brevannes (FR); Yvon Cordier, Paris (FR); Eric Frayssinet, Paris (FR); Mark Kennard, Crolles (FR); Daniel Rondi, Limeil Brevannes (FR)

(73) Assignees: Soitec, Bernin (FR); Centre National de la Recherche Scientifique (CNRS), Paris (FR)

( * ) Notice: Subject to any disclaimer, the term of this patent is extended or adjusted under 35 U.S.C. 154(b) by 0 days.

(21) Appl. No.: 14/129,638

(22) PCT Filed: Jun. 28, 2012

(86) PCT No.: PCT/EP2012/062587
§ 371 (c)(1),
(2), (4) Date: Dec. 27, 2013

(87) PCT Pub. No.: WO2013/001014
PCT Pub. Date: Jan. 3, 2013

(65) Prior Publication Data
US 2014/0327013 A1  Nov. 6, 2014

(30) Foreign Application Priority Data

Jun. 30, 2011  (FR) ...................................... 11 55899

(51) Int. Cl.
*H01L 21/02* (2006.01)
*H01L 29/20* (2006.01)
(Continued)

(52) U.S. Cl.
CPC ............. *H01L 21/0254* (2013.01); *B82Y 20/00* (2013.01); *C30B 25/183* (2013.01);
(Continued)

(58) Field of Classification Search
CPC ................... H01L 21/02381; H01L 21/02378; H01L 21/02458; H01L 21/02505; H01L 21/0254; H01L 29/2003; H01L 25/183; H01L 33/007
USPC ........................................................... 257/76
See application file for complete search history.

(56) References Cited

U.S. PATENT DOCUMENTS 6,617,060 B2   9/2003   Weeks, Jr. et al.
6,649,287 B2   11/2003  Weeks, Jr. et al.
(Continued)

FOREIGN PATENT DOCUMENTS

WO   0195380 A1   12/2001
WO   0229873 A1   4/2002

OTHER PUBLICATIONS

Beaumont et al., Epitaxial Lateral Overgrowth of GaN, Phys. Tat. Sol. B, vol. 227, (2001), p. 1.
(Continued)

*Primary Examiner* — Cathy N Lam
(74) *Attorney, Agent, or Firm* — TraskBritt

(57) ABSTRACT

The invention relates to a method for manufacturing, by means of epitaxy, a monocrystalline layer of GaN on a substrate, wherein the coefficient of thermal expansion is less than the coefficient of thermal expansion of GaN, comprising the following steps: (b) three-dimensional epitaxial growth of a layer of GaN relaxed at the epitaxial temperature, (c1) growth of an intermediate layer of $B_wAl_xGa_yIn_zN$, (c2) growth of a layer of $B_wAl_xGa_yIn_zN$, (c3) growth of an intermediate layer of $B_wAl_xGa_yIn_zN$, at least one of the layers formed in steps (c1) to (c3) being an at least ternary III-N alloy comprising aluminium and gallium, (d) growth of said layer of GaN.

12 Claims, 12 Drawing Sheets

(51) Int. Cl.

| | | |
|---|---|---|
| *H01L 29/872* | (2006.01) | |
| *H01L 33/00* | (2010.01) | |
| *H01L 29/778* | (2006.01) | |
| *C30B 25/18* | (2006.01) | |
| *C30B 29/40* | (2006.01) | |
| *B82Y 20/00* | (2011.01) | |
| *H01S 5/20* | (2006.01) | |
| *H01S 5/30* | (2006.01) | |
| *H01S 5/32* | (2006.01) | |
| *H01S 5/343* | (2006.01) | |

(52) U.S. Cl.
CPC ........ *C30B29/406* (2013.01); *H01L 21/02378* (2013.01); *H01L 21/02381* (2013.01); *H01L 21/02458* (2013.01); *H01L 21/02505* (2013.01); *H01L 21/02636* (2013.01); *H01L 29/2003* (2013.01); *H01L 29/7786* (2013.01); *H01L 29/872* (2013.01); *H01L 33/007* (2013.01); *H01S 5/2009* (2013.01); *H01S 5/305* (2013.01); *H01S 5/3063* (2013.01); *H01S 5/3216* (2013.01); *H01S 5/34333* (2013.01)

(56) References Cited

U.S. PATENT DOCUMENTS

| | | | |
|---|---|---|---|
| 7,118,929 | B2 | 10/2006 | Frayssinet et al. |
| 7,247,889 | B2 | 7/2007 | Hanson et al. |
| 7,339,205 | B2 | 3/2008 | Piner et al. |
| 7,352,015 | B2 | 4/2008 | Piner et al. |
| 7,352,016 | B2 | 4/2008 | Nagy et al. |
| 7,407,548 | B2 | 8/2008 | Bourdelle et al. |
| 7,560,296 | B2 | 7/2009 | Frayssinet et al. |
| 7,572,331 | B2 | 8/2009 | Bourdelle et al. |
| 7,608,526 | B2 | 10/2009 | Cody et al. |
| 7,772,127 | B2 | 8/2010 | Figuet et al. |
| 7,825,401 | B2 | 11/2010 | Cody et al. |
| 8,030,101 | B2 | 10/2011 | Frayssinet et al. |
| 8,084,784 | B2 | 12/2011 | Figuet et al. |
| 2004/0137732 | A1 | 7/2004 | Frayssinet et al. |
| 2004/0200406 | A1 | 10/2004 | Peczalski et al. |
| 2006/0237744 | A1* | 10/2006 | Shahedipour-Sandvik et al. ............ 257/190 |
| 2007/0000435 | A1 | 1/2007 | Bourdelle et al. |
| 2007/0032041 | A1 | 2/2007 | Lester et al. |
| 2007/0051975 | A1 | 3/2007 | Figuet et al. |
| 2007/0072320 | A1 | 3/2007 | Frayssinet et al. |
| 2008/0017952 | A1 | 1/2008 | Cody et al. |
| 2008/0149936 | A1 | 6/2008 | Joblot et al. |
| 2010/0001289 | A1 | 1/2010 | Frayssinet et al. |
| 2010/0006893 | A1 | 1/2010 | Cody et al. |
| 2010/0264463 | A1 | 10/2010 | Figuet et al. |
| 2012/0015497 | A1 | 1/2012 | Gaudin et al. |
| 2012/0100690 | A1 | 4/2012 | Kennard |

OTHER PUBLICATIONS

Blasing et al., The Origin of Stress Reduction by Low-Temperature AlN Interlayers, Appl. Phys. Lett, vol. 81, (2002), p. 2722.

Dadgar et al., MOVPE Growth of GaN on Silicon: Substrates and Strain, Thin Solid Films, vol. 515, (2007), p. 4356.
Frayssinet et al., Growth of Thick GaN Layers on 4-in. and 6 in. Silicon (111) by Metal-Organic Vapor Phase Epitaxy, Phys. Stat. Sol. vol. C 8, (2011), p. 1479.
Frayssinet et al., Micro Epitaxial Lateral Overgrowth of GaN/Sapphire by Metal Organic Vapour Phase Epitaxy, MRS Internet J. Nitride Semicond. Res., vol. 7, (2002), p. 8.
Gundmann et al., Low-Temperature Metalorganic Chemical Vapour Deposition of InP on Si(001), Appl. Pyys. Lett., vol. 58, (1991), p. 284.
Hiramatsu et al., Recent Progress in Selective Area Growth and Epitaxial Lateral Overgrowth of III-Nitrides: Effects of Reactor Pressure in MOVPE Growth, Phy. Stat. Sol. A, vol. 176, (1999), p. 535.
Hiramatsu, Epitaxial Lateral Overgrowth Techniques Used in Group III Nitride Epitaxy, J. Phys.: Condens. Matter, vol. 13, (2001), p. 6961.
International Written Opinion for International Application PCT/EP2012/062587 dated Sep. 12, 2012, 7 pages.
International Preliminary Report on Patentability for International Application No. PCT/EP2012/062587 dated Jan. 7, 2014, 8 pages.
International Search Report for International Application PCT/EP2012/062587 dated Sep. 12, 2012, 4 pages.
Ishikawa et al., High-Quality GaN on Si Substrate Using AlGaN/AlN Intermediate Layer, Phys. Stat. Sol. A, vol. 176, (1999), p. 599.1.
Kappers et al, Threading Dislocation Reduction in (0001) GaN Thin Films Using SiNx Interlayers, J. Cyrst. Growth, vol. 300, (2006), p. 70.
Kappers et al., Low Dislocation Density GaN Growth on High-Temperature AlN Buffer Layers on (0001) Sapphire, J. Cryst. Growth, vol. 312, (2010), p. 363.
Kelly et al., Large Free-Standing GaN Substrates by Hydride Vapor Phase Epitaxy and Laser-Induced Liftoff, Japanese Journal of Applied Physics, Japan Society of Applied Physics, JP, vol. 38, No. 3A, Mar. 1, 1999, pp. L217-L219.
Krost et al., GaN-Based Epitaxy on Silicon: Stress Measurements, Physica Status Solidi. A: Applied Research, Wiley-VCH Verlag, Berlin, Germany, vol. 200, No. 1, Nov. 1, 2003, pp. 26-35.
Lin et al., Growth of GaN Film on 150 mm (111) Using Multilayer AlN/AlGaN Buffer by Metal-Organic Vapor Phase Epitaxy Method, Applied Physics Letter, vol. 91, (2007), pp. 222111-1-222111-3.
Schenk et al, Indium Incorporation Dynamics into AlInN Ternary Alloys for Laser Structures Lattices Matched to GaN, Appl. Phys. Lett., vol. 93, (2008), p. 081116.
Schenk et al. Three Dimensionally Nucleated Growth of Gallium Nitride by Low-Pressure Metalorganic Vapour Phase Epitaxy, J. Cryst. Growth, vol. 258, (2003), p. 232.
Schenk et al., Growth of Thick Continuous GaN Layers on 4-in, Si Subtrates by Metalorganic Chemical Vapour Deposition, Journal of Crystal Growth, Elsevier, Amsterdam, NL, vol. 314, No. 1, Jan. 1, 2011, pp. 85-91.
Vennegues et al., Relaxation Mechanisms in MOVPE Grown Al Rich (Al,Ga)N/GaN Hetero-Structures, J. Appl. Phys., vol. 97, (2005), p. 4912.

\* cited by examiner

METHOD FOR MANUFACTURING A THICK EPITAXIAL LAYER OF GALLIUM NITRIDE ON A SILICON OR SIMILAR SUBSTRATE AND LAYER OBTAINED USING SAID METHOD

CROSS-REFERENCE TO RELATED APPLICATIONS

This application is a national phase entry under 35 U.S.C. §371 of International Patent Application PCT/EP2012/062587, filed Jun. 28, 2012, designating the United States of America and published in English as International Patent Publication WO 2013/001014 A1 on Jan. 3, 2013, which claims the benefit under Article 8 of the Patent Cooperation Treaty and under 35 U.S.C. §119(e) to French Patent Application Serial No. 1155899, filed Jun. 30, 2011, the disclosure of each of which is hereby incorporated herein in its entirety by this reference.

TECHNICAL FIELD

The present invention relates to a method for manufacturing, by means of epitaxy, a crack-free monocrystalline GaN layer on a substrate, wherein the coefficient of thermal expansion is less than the coefficient of thermal expansion of GaN, which is thus suitable for generating tensile strain in the GaN layer.

BACKGROUND

Electronic, optoelectronic and micromechanical components based on group III element nitrides (referred to as "III-N materials") on a silicon substrate represent considerable potential.

In particular, there is a large market for electronic power components based on semiconductors with a large band gap.

Indeed, the use of large band gap semiconductors may help reduce the size and complexity of the electronic circuits wherein they are substantially integrated.

A specific particularly promising application of these materials relates to Schottky type rectifier diodes, suitable for significantly reducing diode-related losses.

Indeed, it is estimated that a motor control unit using silicon-based rectifier diodes suffer from diode-related losses of the order of 2%, whereas the same unit using large band gap semiconductor-based diodes (such as SIC, GaN, etc.) only have diode-related losses of the order of 0.2%.

In the case of the substrate supporting the large band gap semiconductor, to optimize the cost of the component, it should be available in a large size (typically greater than or equal to 6 inches (150 mm)) and have a reasonable cost.

In this respect, silicon is one of the preferred materials due to the low cost thereof, the availability thereof, and the suitability thereof for semiconductor processing methods, which are standardized.

On the other hand, gallium nitride, which is, in theory, the ideal substrate for the epitaxial growth of III-N materials, is not currently available in bulk form under industrially viable conditions (the substrates being too small (i.e., not more than 2 inches (50 mm)) and having an excessively high cost).

Sapphire and silicon carbide are other potentially advantageous candidates, but are too expensive and subject to stock shortages, respectively.

Moreover, epitaxial GaN on sapphire display defects referred to as "micropipes." These defects, caused by the formation of screw dislocation during material growth, typically have a diameter of the order of 250 to 500 nm. A density of these defects of the order of 3 to $6 \cdot 10^5$ cm$^{-2}$ has thus been identified.

However, the silicon substrate, in spite of the advantages mentioned above, has two main drawbacks.

The first is a significant lattice mismatch with respect to III-N materials.

Indeed, for the Si(111) face, the lattice mismatch between GaN (wherein the lattice parameter is 3.189 Å) and Si (the lattice parameter is 3.840 Å) is 16.9%.

Secondly, there is a significant mismatch between the coefficients of thermal expansion of silicon and III-N materials.

In this way, the coefficient of thermal expansion of GaN is $5.59 \cdot 10^{-6}$ K$^{-1}$ whereas that of silicon is $2.59 \cdot 10^{-6}$ K$^{-1}$, representing a thermal mismatch of 53.7%.

Moreover, the divergent contraction of the silicon substrate (which is slow), and that of the III-N epitaxial layers (which is fast), on returning to ambient temperature after epitaxy, results in the layers being placed under tensile strain of +1.4 GPa at ambient temperature.

The lattice parameter mismatch is the source of crystalline defects in the III-N material, which are potentially harmful for component performances (leakage currents, ageing, etc.).

Thermal mismatch, for its part, is the source of cracking formed in the III-N material to relax the strain.

Cracks are macroscopic defects of the III-N material layer, which, due to the discontinuity caused by these cracks on the surface of the GaN layer, are unsuitable for component operation.

To try to remedy these mismatches between the silicon substrate and the epitaxial layer(s) of III-N material, it is known to form, as illustrated in FIG. 1, on a silicon substrate 1, a so-called buffer layer 2 of AlN and grow, by means of epitaxy, a layer 3 of GaN on the buffer layer 2.

Indeed, due to the lattice parameters of GaN (which, as mentioned above, is 3.189 Å) and AlN (which is of the order of 3.112 Å), the layer of GaN is subject to compressive strain when grown epitaxially on a layer of AlN.

In theory, i.e., if GaN grew pseudomorphically on AlN, the compression of GaN could be up to −10.9 GPa, and thus compensate for the tensile strain generated on returning to ambient temperature by the difference in coefficients of thermal expansion between GaN and the silicon substrate.

In fact, due to the high lattice mismatch between GaN and AlN (2.47%), GaN does not grow pseudomorphically but relaxes partially by forming dislocations and/or bending existing dislocations.

As a result, only a portion of the compressive strain generated at the GaN on the AlN interface can be maintained in the layer of GaN and is thus not sufficient to compensate for the tensile strain created during cooling.

In this way, the limit thickness of crack-free GaN in such a structure is around 1 µm, which is too low for most target applications.

To improve retention of the compressive strain in the layer of GaN, various teams have proposed forming, between the buffer layer and the layer of GaN, one or a plurality of "intermediate" layers.

A first process is that of the epitaxial growth of one or a plurality of layers of $Al_xGa_{1-x}N$ (where 0<x<1) suitable for better retention of compression by graduating the aluminium content between the layer of AlN and the final layer of GaN.

One can refer to the works by H. Ishikawa, G. Y. Zhao, N. Nakada, T. Egawa, T. Soga, T. Jimbo, M. Umeno, High-quality GaN on Si substrate using AlGaN/AlN intermediate layer, Phys. Stat. Sol. A 176, 599 (1999), and U.S. Pat. No. 6,617,060 proposing the insertion, between the buffer layer of AlN and the useful layer of GaN, of a transition layer, wherein the Al composition decreases gradually on approaching the interface with the layer of GaN.

Alternatively, the transition layer may consist of a stack of layers wherein the Al content progressively decreases discretely.

The study by M. Hiberlen, D. Zhu, C. McAleese, M. J. Kappers, C. J. Humphreys, Dislocation reduction in MOCVD grown GaN layers on Si(111) using two different buffer layer approaches, 13th European Workshop on Metalorganic Vapor Phase Epitaxy (EWMOVPE-XIII), Ulm, Germany, Jun. 7-10, 2009 (B-11), shows that, compared to a continuous variation in the aluminium content, a discrete variation makes it possible to reduce the dislocation density within the final layer of GaN significantly (of the order of $10^8$ cm$^{-2}$ as opposed to $10^9$ cm$^{-2}$).

U.S. Pat. Nos. 6,649,287; 7,247,889; 7,339,205; 7,352,015; and 7,352,016 describe similar transition layers to that described above.

However, the literature relating to this type of structure, supported by experiments conducted by the inventors, demonstrates that it makes it possible to obtain a continuous crack-free layer of GaN wherein the thickness is not more than 2.5 μm.

This thickness remains too small for most of the target applications.

A second type of solution is the epitaxy of an alternation of layers of AlN and layers of GaN.

WO 01/95380 thus proposes, as illustrated in FIG. 2, a structure successively comprising a silicon substrate 1, a buffer layer 2 of AlN, a first layer 3a of GaN, an intermediate layer 4 of AlN and the useful layer 3 of GaN.

The intermediate layer 4 is monocrystalline and has a lattice parameter less than that of the layer 3 of GaN, enabling the compression of the overlying layer 3 of GaN during epitaxy with a view to compensating at least partially for the tensile strain generated during cooling.

Such a structure makes it possible to obtain a crack-free layer 3 of approximately 3 to 4 μm, which is significant but too small for some target applications.

FIG. 3 shows an alternative embodiment of this structure, which successively comprises a silicon substrate 1, a buffer layer 2 of AlN, a first layer 3a of GaN, a first intermediate layer 4a of AlN, a second layer 3b of GaN, a second intermediate layer 4b of AlN and a useful layer 3 of GaN.

Inserting the second intermediate layer 4b of AlN in the structure makes it possible to increase the thickness of the useful layer 3 of GaN, but to an extent that remains insufficient for some of the target applications.

The aim of the invention is thus that of defining a method for manufacturing by means of epitaxy, a crack-free layer of GaN that is thicker than the layers obtained to date.

More specifically, the aim of the invention is that of producing a continuous useful layer of GaN (i.e., in one piece, not containing any layer of a material other than GaN) having a thickness greater than 5 μm and having a dislocation density less than or equal to $5 \cdot 10^8$ cm$^{-2}$ on a substrate optionally greater than or equal to 6 inches (150 mm) in diameter.

DISCLOSURE

The invention proposes a method for manufacturing, by means of epitaxy, a monocrystalline useful layer of GaN on a substrate, wherein the coefficient of thermal expansion is less than the coefficient of thermal expansion of GaN, the substrate thus being suitable for generating tensile strain in the useful layer.

The method is characterized in that it comprises the following successive steps:
(a) formation, on the substrate, of a buffer layer of AlN,
(b) three-dimensional epitaxial growth, directly on the buffer layer, of a layer of GaN relaxed at the epitaxial temperature,
(c1) epitaxial growth, on the layer of GaN, of a first intermediate layer having the composition $B_wAl_xGa_yIn_zN$, where $w+x+y+z=1$ and $0.5<x\leq1$, $0\leq y<1$, $0\leq w<1$ and $0\leq z<1$,
(c2) epitaxial growth of a layer having the composition $B_wAl_xGa_yIn_zN$, where $w+x+y+z=1$ and $0\leq x<0.5$, $0\leq y<1$, $0\leq w<1$ and $0\leq z<1$,
(c3) epitaxial growth of a second intermediate layer having the composition $B_wAl_xGa_yIn_zN$, where $w+x+y+z=1$ and $0.5<x\leq1$, $0\leq y<1$, $0\leq w<1$ and $0\leq z<1$,
at least one of the layers formed in steps (c1) to (c3) being an at least ternary III-N alloy comprising aluminium and gallium,
(d) epitaxial growth of the useful layer of GaN.

Herein, the term "on" relating to the position of a first layer with respect to a second layer does not necessarily imply that the first layer is directly in contact with the second; unless specified otherwise, this term does not rule out that one or a plurality of layers are inserted between the first layer and the second.

According to one preferred embodiment of the invention, the diameter of the substrate is greater than or equal to 6 inches (150 mm).

Particularly advantageously, step (d) comprises the epitaxial growth of the useful layer of GaN over a thickness of at least 5 μm.

According to one preferred embodiment of the invention, the first and the second intermediate layer have a thickness between 10 and 50 nm; the layer having the composition $B_wAl_xGa_yIn_zN$, where $w+x+y+z=1$ and $0\leq x<0.5$, $0\leq y<1$, $0\leq w<1$ and $0\leq z<1$, formed between the intermediate layers having a thickness between 0.5 and 2 μm.

Preferably, the aluminium content x of the first and second intermediate layer is between 0.8 and 1 and the aluminium content x of the layer formed between the intermediate layers is between 0 and 0.2.

According to one particular embodiment of the invention, the method comprises, between steps (c3) and (d), the following successive steps:
(c4) formation of a first transition layer having the composition $B_wAl_xGa_yIn_zN$, where $w+x+y+z=1$ and $0\leq x<0.5$, $0\leq y<1$, $0\leq w<1$ and $0\leq z<1$, with a dopant concentration less than $10^{18}$ cm$^{-3}$,
(c5) formation of a second transition layer having the composition $B_wAl_xGa_yIn_zN$, where $w+x+y+z=1$ and $0\leq x<0.5$, $0\leq y<1$, $0\leq w<1$ and $0\leq z<1$, preferably with a concentration gradually increasing to not more than $10^{19}$ cm$^{-3}$,
(c6) formation of a third transition layer having the composition $B_wAl_xGa_yIn_zN$, where $w+x+y+z=1$ and $0\leq x<0.5$, $0\leq y<1$, $0\leq w<1$ and $0\leq z<1$, with a dopant concentration less than $10^{19}$ cm$^{-3}$
(c7) formation of a fourth transition layer having the composition $B_wAl_xGa_yIn_zN$, where $w+x+y+z=1$ and $0\leq x<0.5$, $0\leq y<1$, $0\leq w<1$ and $0\leq z<1$, with x gradually decreasing to 0 and a dopant concentration less than $10^{19}$ cm$^{-3}$.

Preferably, the method is implemented by means of metalorganic vapor phase epitaxy (MOVPE).

The substrate can be selected from the following substrates: Si(111), Si(110), Si(100), porous Si, silicon-on-polycrystalline SiC (SopSiC), 4H—SiC, 6H—SiC, 3C—SiC/Si (111), and silicon-on-insulator (SOI).

According to an advantageous embodiment, the substrate is a silicon substrate doped with boron such that the resistivity of the substrate is less than 5 mΩ·cm, preferably less than 2 mΩ·cm.

Optionally, the substrate may be additionally doped with nitrogen.

After the epitaxial growth of the useful layer of GaN, it is possible to transfer the useful layer onto a substrate, for example, using the SMARTCUT® process.

Alternatively, it is possible, after the epitaxial growth of the useful layer of GaN over a thickness of at least 5 μm, to remove the useful layer from the structure whereon it has undergone epitaxy, so as to form a self-supporting layer of GaN.

A further aspect of the invention relates to a structure comprising a monocrystalline useful layer of GaN on a substrate, wherein the coefficient of thermal expansion is less than the coefficient of thermal expansion of GaN, the structure being characterized in that it successively comprises:
- a monocrystalline layer of GaN under tensile strain at ambient temperature,
- a first monocrystalline intermediate layer having the composition $B_wAl_xGa_yIn_zN$, where $w+x+y+z=1$ and $0.5<x\leq1$, $0\leq y<1$, $0\leq w<1$ and $0\leq z<1$,
- a monocrystalline layer having the composition $B_wAl_xGa_yIn_zN$, where $w+x+y+z=1$ and $0\leq x<0.5$, $0\leq y<1$, $0\leq w<1$ and $0\leq z<1$,
- a second monocrystalline intermediate layer having the composition $B_wAl_xGa_yIn_zN$, where $w+x+y+z=1$ and $0.5<x\leq1$, $0\leq y<1$, $0\leq w<1$ and $0\leq z<1$,
- the useful layer of GaN, and in that at least one of the layers between the monocrystalline layer of GaN under tensile strain at ambient temperature and the useful layer of GaN is made of an at least ternary III-N alloy comprising aluminium and gallium.

Particularly advantageously, the diameter of the useful layer of GaN is greater than or equal to 6 inches (150 mm).

Moreover, the useful layer of GaN may have a thickness greater than or equal to 5 μm while being free from cracks.

The useful layer of GaN may also have a dislocation density less than or equal to $5\times10^8$ cm$^{-2}$.

According to one preferred embodiment of the invention, the monocrystalline layer of GaN under tensile strain at ambient temperature is between 1 and 5 μm, preferably between 1 and 2 μm.

Moreover, the first and second intermediate layer may have a thickness between 10 and 50 nm, and the layer having the composition $B_wAl_xGa_yIn_zN$, where $w+x+y+z=1$ and $0\leq x<0.5$, $0\leq y<1$, $0\leq w<1$ and $0\leq z<1$, formed between the intermediate layers may have a thickness between 0.5 and 2 μm.

Advantageously, the aluminium content x of the first and second intermediate layer is between 0.8 and 1 and the aluminium content x of the layer formed between the intermediate layers is between 0 and 0.2.

The substrate is preferentially selected from the following substrates: Si(111), Si(110), Si(100), porous Si, silicon-on-polycrystalline SiC (SopSiC), 4H—SiC, 6H—SiC, 3C—SiC/Si(111), and silicon-on-insulator (SOI).

According to one preferred embodiment of the invention, the structure comprises, between the substrate and the monocrystalline layer of GaN under tensile strain at ambient temperature, a buffer layer, the monocrystalline layer of GaN under tensile strain being advantageously on the buffer layer.

The buffer layer is advantageously a layer of AlN.

According to one particular embodiment of the invention, the structure successively comprises, between the second intermediate layer and the useful layer:
- a first transition layer having the composition $B_wAl_xGa_yIn_zN$, where $w+x+y+z=1$ and $0\leq x<0.5$, $0\leq y<1$, $0\leq w<1$ and $0\leq z<1$, with a dopant concentration less than $10^{18}$ cm$^{-3}$;
- a second transition layer having the composition $B_wAl_xGa_yIn_zN$, where $w+x+y+z=1$ and $0\leq x<0.5$, $0\leq y<1$, $0\leq w<1$ and $0\leq z<1$, preferably with a concentration gradually increasing to not more than $10^{19}$ cm$^{-3}$;
- a third transition layer having the composition $B_wAl_xGa_yIn_zN$, where $w+x+y+z=1$ and $0\leq x<0.5$, $0\leq y<1$, $0\leq w<1$ and $0\leq z<1$, with a dopant concentration less than $10^{19}$ cm$^{-3}$;
- a fourth transition layer having the composition $B_wAl_xGa_yIn_zN$, where $w+x+y+z=1$ and $0\leq x<0.5$, $0\leq y<1$, $0\leq w<1$ and $0\leq z<1$, with x gradually decreasing to 0 and a dopant concentration less than $10^{19}$ cm$^{-3}$.

The useful layer may comprise a layer of n− doped GaN on a layer of n+ doped GaN.

In one particular embodiment of the invention, the structure solely consists of III-N alloys wherein the III material is aluminium and/or gallium (in other words, the boron and indium contents of the various layers of the structure are zero).

The invention also relates to a self-supporting monocrystalline layer of GaN having a thickness greater than or equal to 5 μm, a diameter greater than or equal to 6 inches (150 mm) and a dislocation density less than or equal to $5\times10^8$ cm$^{-2}$, the layer being devoid of cracks.

Such a layer may be obtained by detaching the useful layer from the structure described above.

A further aim of the invention is a structure comprising a monocrystalline layer of GaN on a substrate, the layer of GaN having a thickness greater than or equal to 5 μm, a diameter greater than or equal to 6 inches (150 mm) and a dislocation density less than or equal to $5\times10^8$ cm$^{-2}$.

The structure may be obtained by transferring, onto the substrate, the useful layer of the structure described above.

A further aim of the invention relates to an electronic, optoelectronic or micromechanical device formed in or on a useful layer of GaN as described above, whether it is self-supporting, integrated in the structure forming the basis for the epitaxial growth thereof or mounted on a substrate after epitaxy.

For example, the device comprises a Schottky diode.

BRIEF DESCRIPTION OF THE DRAWINGS

Further features and advantages of the invention will emerge from the detailed description hereinafter, with reference to the appended figures wherein.

For easier representation of the various layers, the thickness ratios thereof have not necessarily been observed.

DETAILED DESCRIPTION

Hereinafter, the term "epitaxy" refers to any method enabling oriented growth of a monocrystalline material on another monocrystalline material.

The term "epitaxy" thus particularly covers the techniques known as "Metalorganic vapor phase epitaxy" (MOVPE), or Metalorganic chemical vapor deposition (MOCVD), or Molecular beam epitaxy (MBE), and Hydride vapor phase epitaxy (HYPE).

Although MOVPE epitaxy is preferred due to the industrial application thereof, all the epitaxy steps mentioned hereinafter can be implemented using each of these techniques.

Optionally, some epitaxy steps are performed using one technique and other steps using another technique.

Figure 4:
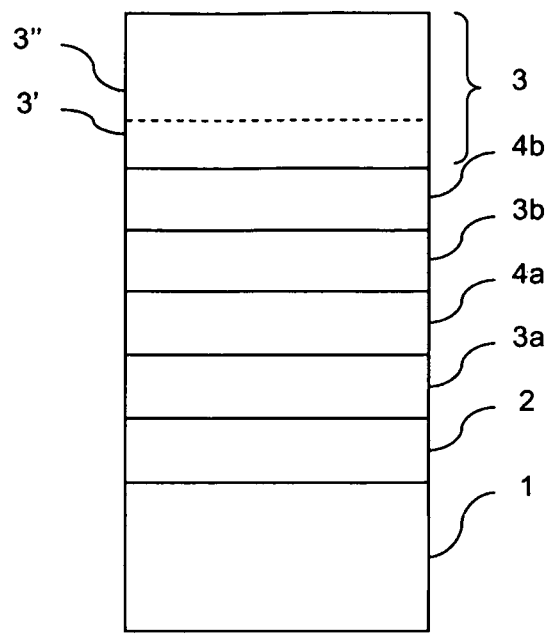
FIG. 4 is a cross-sectional diagram of a structure according to a first embodiment of the invention.
Figure 5:
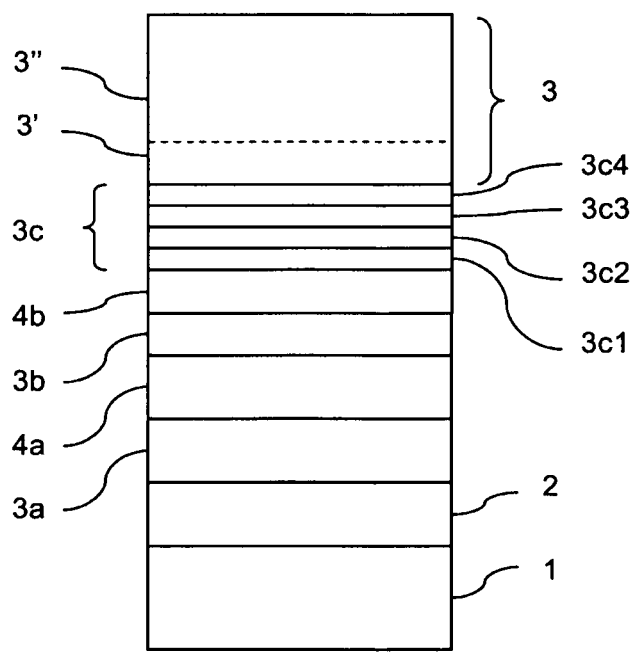
FIG. 5 is a cross-sectional diagram of a structure according to another embodiment of the invention.

FIGS. 4 and 5 illustrate two structures according to the invention.

Unless otherwise specified, the common reference signs for these figures refer to identical or similar elements.

One of the specificities of these structures is that at least one of the layers between the buffer layer of AlN and the useful layer of GaN is not a binary III-N alloy such as AlN or GaN but an at least ternary III-N alloy (such as AlGaN), or quaternary (for example, AlGaInN) or quinary (BAlGaInN) alloy.

As seen hereinafter, when the structure contains at least one layer made of an at least ternary alloy, the compressive strain applied to the useful layer by the intermediate layer is greater than when the structure only comprises binary alloys, enabling the growth of a thicker useful layer of GaN without forming cracks.

Substrate

The substrate 1 is advantageously a monocrystalline substrate, which is available in large sizes (typically greater than 6 inches (150 mm), for example, in 8 inches (200 mm)), inexpensive and suitable for the epitaxial growth of III-N materials.

In this respect, silicon is a particularly preferred material.

The remainder of the description will thus be based on a silicon substrate.

In the detailed examples given hereinafter, the substrate 1 is a silicon substrate obtained using the Czochralski (Cz) method, highly doped (B+) with boron (conveyed by a resistivity of less than 5 mΩ·cm), having a thickness of 650 to 1300 μm, provided with or devoid of a flat area.

Alternatively, the substrate 1 may be a silicon substrate with a very high (B++) boron doping, such that its resistivity is less than 2 mΩ·cm.

In addition to the B+ or B++ doping, the silicon substrate 1 may also be doped with nitrogen, the N concentration being of the order of $5 \times 10^{14}$ cm$^{-3}$.

With such a very high boron doping and/or nitrogen co-doping, the silicon substrate 1 presents a greater yield strength, thereby providing to the grown GaN layer a greater compressive strain, which in turn better compensates for the tensile strain during cooling.

A useful GaN layer 3 having a thickness of more than 7 μm can thus be obtained without any crack.

However, the invention is applicable to any substrate having the same features as silicon in respect of the target applications.

For example, the substrate may be a silicon substrate obtained using the Floating Zone (FZ) method and/or doped with arsenic or phosphorus and/or having a thickness between 650 and 2000 μm.

Moreover, the substrate may be a bulk substrate or formed of an assembly of layers; it may have undergone a structuring method (masking, slicing, etc.), or any chemical and/or physical treatment (implantation, doping, etc.).

In this way, the substrate may be Si(111), Si(110), Si(100), implanted Si, porous Si, 4H—SiC, 6H—SiC, a SopSiC ("Silicon-on-poly SiC") type substrate, a 3C—SiC/Si(111) type substrate, a sliced Si(111) substrate, an SOI ("Silicon-on-Insulator") substrate, etc.

In particular, a SopSiC type substrate is particularly advantageous for forming structures wherein a very low dislocation density and high heat dissipation are sought.

Prior to the growth of the buffer layer 2, the substrate 1 may be subjected to a silane flow followed by annealing in hydrogen or nitrogen (for example, at 1000° C. for 20 minutes in H$_2$).

This prior and optional treatment makes it possible to obtain a deoxidized, decontaminated and relatively smooth surface on the substrate, optimizing the crystalline quality of the layer subsequently grown therein.

Naturally, any other method for preparing the substrate surface may be implemented, for example, a chemical method as described in the articles by J. Bläsing, A. Reiher, A. Dadgar, A. Diez, A. Krost, The origin of stress reduction by low-temperature AlN interlayers, Appl. Phys. Lett. 81, 2722 (2002), and M. Grundmann, A. Krost, D. Bimberg, Low-temperature metalorganic chemical vapor deposition of InP on Si(001), Appl. Phys. Lett. 58, 284 (1991).

Buffer Layer

The buffer layer 2 is a layer of AlN having a thickness between 50 and 500 nm, preferably of the order of 200 nm.

Optimal conditions for growth of the buffer layer are described in the article by E. Frayssinet, Y. Cordier, H. P. D. Schenk, A. Bayard, Growth of thick GaN layers on 4-in. and 6-in. silicon (111) by metal-organic vapor phase epitaxy, Phys. Stat. Sol. C 8, 1479 (2011), to which reference may be made.

This buffer layer 2 is sufficiently thick to form a diffusion barrier of the precursor (TMGa or Trimethylgallium) with respect to the supporting substrate 1, to prevent the corrosion of the silicon by TMGa.

Moreover, this layer 2 is relaxed at the epitaxial temperature so as to form a template for subsequent epitaxial growth of the various layers.

If the buffer layer 2 is produced by means of MOVPE, the thickness thereof will be limited to not more than 500 nm due to the low growth rate of AlN.

Alternatively, the buffer layer 2 is produced by means of HVPE and may, in this case, reach a thickness of the order of 1 µm.

3D GaN Layer

On the buffer layer 2, a layer 3a of GaN is grown three-dimensionally, such that it is completely relaxed at the epitaxial temperature.

Three-dimensional (3D) growth is a growth mode of the GaN layer 3a whereby nucleation first takes place, on the underlying buffer layer 2 of AlN, of islands of GaN, growing in a direction perpendicular to the surface of the buffer layer 2 and also, laterally, in a direction parallel with the surface, until the islands coalesce.

In the 3D growth phase, the vertical growth rate (i.e., perpendicular to the surface of the buffer layer 2) is considerably greater than the lateral growth rate, whereas, in the coalescence phase, the lateral growth rate is considerably greater than the vertical growth rate.

The advantage of such a growth mode is that, during coalescence, most of the intrinsic dislocations in the GaN tend to bend and cancel each other out in the form of loops, giving rise to a reduction in the dislocation density of several orders of magnitude with respect to a layer wherein the growth was two-dimensional (2D) (i.e., consisting of uniform nucleation of the GaN on the surface of the underlying buffer layer 2 followed by uniform growth in a direction perpendicular to the surface of the buffer layer 2).

This mechanism for reducing dislocations and the methods for obtaining three-dimensional growth have already been the subject of extensive research published in the scientific literature.

For the implementation of the invention, any known three-dimensional growth mode may be used, particularly one of the embodiments described below.

The layer 3a of GaN is grown over a sufficient thickness to achieve complete coalescence, optionally with a greater thickness to improve the crystalline quality of the layer 3a.

As a general rule, the thickness of the layer 3a of GaN is between 1 and 5 µm, preferably between 1 and 2 µm, and more preferably of the order of 1.5 µm.

However, it is possible, by adapting the growth conditions, to delay the coalescence so as to form a thicker layer 3a.

The layer 3a of GaN is formed directly on the buffer layer 2 of AlN, i.e., no layer, for example, of AlGaN, is inserted between the buffer layer 2 and the layer 3a of GaN (with the exception of an optional mask deposited with a view to promoting 3D growth).

The layer 3a of GaN obtained by means of three-dimensional growth is thus characterized by a very low intrinsic dislocation density and a relaxed state (or at least more relaxed than a 2D layer) at the epitaxial temperature.

Figure 1:
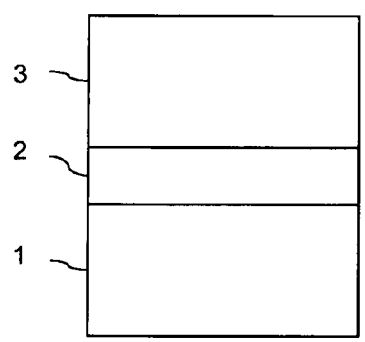
FIG. 1 is a cross-sectional diagram of a known structure successively comprising a silicon substrate, a buffer layer of AlN and a useful layer of GaN.

In this way, by way of comparison, for a structure consisting successively of a substrate 1 of Si(111), a buffer layer 2 of AlN and a layer 3 of one micrometer of 2D GaN (see FIG. 1), an emerging dislocation density of the order or greater than $5 \cdot 10^9$ cm$^{-2}$ is observed, wherein, for a similar structure wherein the layer of GaN 3a has grown three-dimensionally on a mask of SiN, the emerging dislocation density is of the order or less than $3 \cdot 10^9$ cm$^{-2}$.

This gives rise, on returning to ambient temperature after epitaxy, to very high tensile strain in the layer of GaN 3a (i.e., higher than if the layer had been subject to 2D epitaxial growth) due to the significant difference between the coefficient of thermal expansion of GaN and that of the silicon substrate 1.

The three-dimensional growth of this layer 3a can be detected by various structure inspection means.

Figure 6:
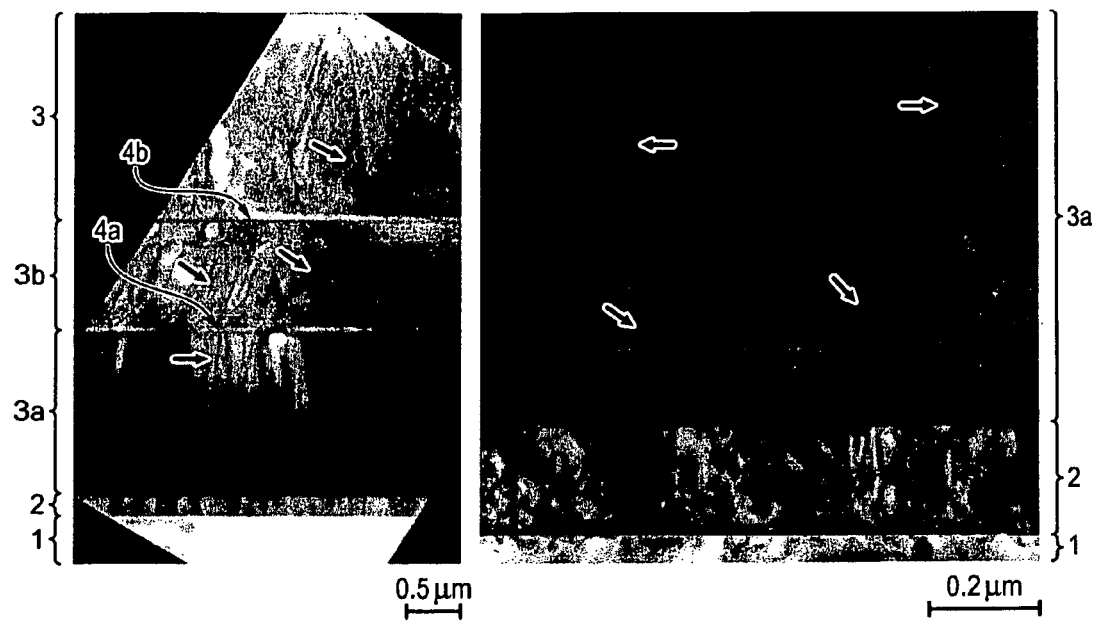
FIG. 6 is a partial TEM image of a structure according to the invention.

For instance, transmission electron microscopy (TEM) makes it possible to view, as in FIG. 6, the direction of the dislocations in the various layers of the structure.

Indeed, FIG. 6 is a TEM image of a structure as illustrated in FIG. 4.

The image on the left shows the complete structure, whereon it is possible to observe, in the 3D layer 3a of GaN, vertical dislocations (i.e., perpendicular to the surface of the substrate 1), whereas in the overlying layers of GaN 3b and 3, the dislocations are inclined. Some dislocations are shown by arrows.

The image on the right is an enlargement of the previous image in the vicinity of the 3D layer 3a of GaN with the buffer layer 2 of AlN.

It is possible to observe in the layer 3a, in the vicinity of the buffer layer 2, curved dislocations joining each other and cancelling each other out during islands of coalescence, whereas in the portion of the layer 3a furthest from the buffer layer 2, the dislocations adopt a vertical direction after coalescence.

Moreover, the very particular state of strain of this 3D layer 3a may be detected by means of High-Resolution (HR) mode X-ray diffractometry (XRD).

Figure 7:
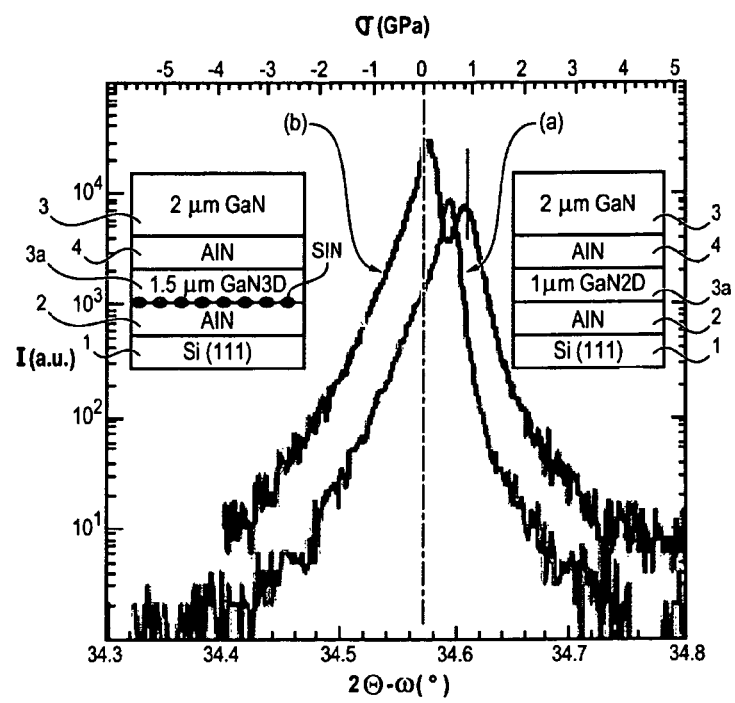
FIG. 7 is a comparative XRD diagram of two structures including one according to the invention.

FIG. 7 thus illustrates the diffraction curves of two structures successively consisting of a substrate 1 of Si(111), a buffer layer 2 of AlN, a first layer 3a of GaN, an intermediate layer 4 of AlN and second layer 3b of GaN.

Curve (a) consists of a reference structure wherein the first layer 3a of GaN was formed over 1 µm by two-dimensional growth on the buffer layer 2 of AlN; curve (b) consists of a structure wherein, as in the invention, the layer 3a of GaN was formed over 1.5 µm by three-dimensional growth on the buffer layer 2 by means of a SiN mask illustrated by dotted lines.

On this curve, the lower x-axis represents the angle of diffraction 2θ-ω, expressed in degrees (where ω is the angle between the incident beam and the surface of the sample and 2θ is the angle between the incident beam and the diffracted beam), whereas the upper axis represents the strain a in one plane, expressed in GPa.

On this axis, the origin (0) consists of a relaxation of the layer in question, whereas the points situated in the left part of the curve consist of negative (compressive) strain and those situated in the right part of the curve consist of positive, i.e., tensile, strain.

The y-axis represents the intensity (I) of the diffracted X-ray beam.

On curve (a), a single peak is observed, corresponding to a tensile strain of the order of +0.6 GPa, from which it is deduced that the two layers $3a$, $3b$ of GaN, both obtained by 2D growth, have the same state of tensile strain at ambient temperature.

On curve (b), a first, more intense, peak is observed, corresponding to a zero strain, and a second peak corresponding to a tensile strain of the order of +0.8 GPa.

The first peak is attributed to the upper layer $3b$ of GaN, whereas the second is attributed to the 3D layer $3a$ of GaN.

In this structure, separation of the state of strain of both GaN layers $3a$, $3b$ is observed: the first $3a$, grown in a relaxed manner (3D), is thus subject to high tensile strain at ambient temperature, but the second layer $3b$ of GaN is substantially relaxed at ambient temperature, demonstrating that it has retained the compressive strain generated at the interface with the intermediate layer 4 of AlN.

In-Situ Masking

According to a first embodiment, in-situ silicon nitride (having the general formula SiN but suitable for having various stoichiometries) masking is performed on the buffer layer of AlN.

This SiN mask, which is not continuous, has openings through which the surface of the buffer layer of AlN is exposed and/or acts as an antisurfactant, which, by reducing the free surface energy, induces 3D nucleation.

This masking is referred to as "in-situ" since it is carried out inside the epitaxial frame, for example, by means of a silane and ammonia flow applied for a few seconds to a few minutes, before introducing precursors for GaN growth.

The density of the mask, and thus of the islands of GaN liable to be formed, may be controlled by the silane/ammonia treatment time.

In this respect, reference may be made to the following documents: E. Frayssinet, B. Beaumont, P. Gibart, J. P. Faurie, "Process for producing an epitaxial layer of gallium nitride"; U.S. Pat. No. 7,118,929; E. Frayssinet, B. Beaumont, J. P. Faurie, P. Gibart, Zs. Makkai, B. Pécz, P. Lefebvre, P. Valvin, "Micro epitaxial lateral overgrowth of GaN/sapphire by metal organic vapour phase epitaxy," MRS Internet J. Nitride Semicond. Res. 7, 8 (2002); H. P. D. Schenk, P. Vennégués, O. Tottereau, T. Riemann, J. Christen, "Three dimensionally nucleated growth of gallium nitride by low-pressure metalorganic vapour phase epitaxy," J. Cryst. Growth 258, 232 (2003); M. J. Kappers, R. Datta, R. A. Oliver, F. D. G. Rayment, M. E. Vickers, C. J. Humphreys, "Threading dislocation reduction in (0001) GaN thin films using SiNx interlayers," J. Cryst. Growth 300, 70 (2006); and M. J. Kappers, M. A. Moram, D. V. S. Rao, C. McAleese, C. J. Humphreys, "Low dislocation density GaN growth on high-temperature AlN buffer layers on (0001) sapphire," J. Cryst. Growth 312, 363 (2010).

During the epitaxy of GaN, the islands of GaN nucleate on the exposed AlN surface but not on the mask.

The epitaxial conditions are first selected to promote growth of the islands in a direction perpendicular to the buffer layer, followed by lateral growth until the islands join and coalesce.

Moreover, as indicated above, the dislocations present in the islands of GaN tend to bend and join during coalescence, resulting in them cancelling each other out.

Finally, in-situ masking may be carried out with a different material to SiN.

For example, it is possible to use boron nitride (having the general formula BN, but optionally having various stoichiometries), as described in the article by L. R. Khoshroo, I. D. Booker, J. F. Woitok, C. Mauder, H. Behmenburg, A. Vescan, H. Kalisch, R. H. Jansen, M. Heuken, "Application of boron nitride as in-situ masking layer for MOCVD grown GaN," 6th International Workshop on nitride semiconductors (IWN 2010), Tampa, Fla., Sep. 19-24, 2010 (A3.4), pg. 134.

Ex-Situ Masking

Alternatively, ex-situ masking may be carried out enabling selective growth of the GaN in the form of islands in the mask openings.

The term "ex-situ masking" means that the mask is formed outside the epitaxial frame.

For example, the mask may be formed by depositing a continuous layer of a masking material on the buffer layer, and by creating, by means of a photolithographic technique, openings in the mask exposing the surface of the buffer layer.

The mask typically consists of a dielectric material, such as $SiO_2$ or SiN, or tungsten.

As in the previous case, the epitaxy of GaN is selective, i.e., islands of GaN are formed in the buffer layer of AlN that is exposed via the openings of the mask, but not on the mask.

The mask forms a barrier to the dislocations of the underlying layer of AlN, which thus cannot be propagated in the GaN layer.

Consequently, the regions of the GaN layer situated on the mask are free from dislocations.

This technique is known as ELO (Epitaxial Lateral Overgrowth).

One alternative, referred to as "pendeo-epitaxy" typically consists of forming, in a seed layer of GaN formed on the buffer layer, islands of GaN, covering the same with a dielectric mask, and resuming the epitaxy in order to first grow laterally and then in a direction perpendicular to the surface of the buffer layer until coalescence of the GaN layer.

These various methods and the alternative embodiments thereof are particularly described in the publications by K. Hiramatsu, K. Nishiyama, A. Motogaito, H. Miyake, Y. Iyechika, T. Maeda, "Recent progress in selective area growth and epitaxial lateral overgrowth of III-nitrides: Effects of reactor pressure in MOVPE growth," Phys. Stat. Sol. A 176, 535 (1999); B. Beaumont, P. Vennégués, P. Gibart, "Epitaxial lateral overgrowth of GaN," Phys. Stat. Sol. B 227, 1 (2001); and K. Hiramatsu, "Epitaxial lateral overgrowth techniques used in group III nitride epitaxy," J. Phys.: Condens. Matter 13, 6961 (2001).

Three-Dimensional Growth without Masking

Finally, it is also possible to obtain three-dimensional growth of the layer of GaN without using a mask, by adapting the growth conditions so as to induce 3D growth or 2D/3D transition.

Indeed, those skilled in the art would be capable of adjusting the epitaxial pressure (an increase in pressure being favorable for 3D growth) and/or on the ratio between the III-N precursors (a decrease in the $NH_3$/TMGa ratio being favorable for 3D growth) with a view to obtain the desired growth conditions.

First Intermediate Layer of $B_wAl_xGa_yIn_zN$, where $w+x+y+z=1$ and $0.5<x\le1$, $0\le y<1$ and $0\le w$ and $z<1$ On the 3D layer $3a$ of GaN, a first intermediate layer $4a$ of nitride containing at least aluminium and gallium (and optionally indium and/or boron), wherein the aluminium content x is at least 0.5, and preferably between 0.8 and 1, is grown.

Indeed, the AlN content and the thickness of this layer 4a should be sufficient such that this layer 4a does not grow pseudomorphically on the underlying layer 3a of GaN.

Indeed, the thickness of the layer 4a and the lattice mismatch thereof with the underlying layer 3a of GaN should be sufficient such that the first intermediate layer 4a grows in a relaxed manner or is relaxed following the growth thereof.

In this way, the thickness of this first intermediate layer 4a is typically between 10 and 50 nm.

For an intermediate layer consisting of a binary alloy (AlN), the thickness is preferably 15 to 17 nm.

For an intermediate layer having the composition $Al_{0.8}Ga_{0.2}N$, the thickness is preferentially 25 nm.

As a general rule, the thickness of the intermediate layer, when formed from an at least ternary alloy, is determined such that the overall aluminium content of the layer is of the same magnitude as that of the intermediate layer 4a of binary alloy mentioned above.

Moreover, the intermediate layer may be n-doped, for example, from a non-exhaustive using silane ($SiH_4$), disilane ($Si_2H_6$), isobutylsilane (SiCH), tetraethylsilane (TeESi), or germane ($GeH_4$).

The role of this first intermediate layer 4a is that of compressing the layer grown epitaxially thereon.

Layer of $B_wAl_xGa_yIn_zN$, where $w+x+y+z=1$ and $0 \leq x < 0.5$, $0 < y \leq 1$ and $0 \leq w$ and $z < 1$ On the first intermediate layer 4a, a layer 3b having the composition $B_wAl_xGa_yIn_zN$, where $w+x+y+z=1$ and $0 \leq x < 0.5$, $0 < y \leq 1$ and $0 \leq w$ and $z < 1$, is grown.

The growth mode is, in this case, two-dimensional.

Unlike the intermediate layer 4a whereon it is formed, this layer 3b has a low aluminium content, x being between 0 and 0.2, preferably between 0 and 0.14.

It preferentially has a thickness between 0.5 and 2 µm.

The growth conditions are selected such that this layer 3b grows in a 2D and not 3D manner, i.e., with a low epitaxial pressure and/or a high III/N precursor ratio.

Since it is formed on an intermediate layer 4a having a higher aluminium content, thus having a lower lattice parameter, the low aluminium content layer 3b is compressed during epitaxy.

However, at the epitaxial temperature, the 3D layer 3a of GaN acts as a relaxed template for the epitaxy of the intermediate layer 4a and the layer 3b of $B_wAl_xGa_yIn_zN$ with a low aluminium content.

The layer 3b of $B_wAl_xGa_yIn_zN$ with a low aluminium content can then retain the compressive strain generated at the interface with the intermediate layer 4a.

It is possible to adjust the aluminium content: increasing this content makes it possible to reduce the lattice mismatch with the underlying intermediate layer 4a and thus slow down the relaxation of the layer 3b of $B_wAl_xGa_yIn_zN$ with a low aluminium content.

As a result, at ambient temperature, while the 3D layer 3a of GaN is subject to high tensile strain, the layer 3b of $B_wAl_xGa_yIn_zN$ with a low aluminium content is practically at equilibrium, the compressive strain maintained in layer 3b having compensated for the tensile strain generated during cooling.

FIG. 7 mentioned above shows this strain scenario.

According to curve (a) (structure comprising two 2D layers of GaN), the two layers 3a and 3b of GaN are in the same state of tensile strain (peak at +0.6 GPa) at ambient temperature.

On the other hand, curve (b) (structure comprising a first 3D layer of GaN and a second 2D layer of GaN) has two peaks:

the peak at +0.8 GPa corresponds to the high tensile strain applied to the 3D layer 3a of GaN, at ambient temperature;

the peak around 0 GPa corresponds to the substantially relaxed state at ambient temperature of the 3D layer 3b of GaN.

This demonstrates that the 3D growth of the layer 3a of GaN on the buffer layer 2 of AlN made it possible to separate the states of strain of the 3D layer 3a of GaN and the 2D layer 3b of GaN.

The value of the compressive strain "recovered" by the layer 3b of $B_wAl_xGa_yIn_zN$ with a low aluminium content is of the order of −0.8 GPa, equivalent to approximately 7% of the theoretical compression (which is −10.9 GPa as seen above) generated at the interface with the intermediate layer 4a.

Advantageously, it is possible to introduce in-situ or ex-situ masking (as described above) on the intermediate layer 4a, prior to the growth of the layer 3b. This growth may thus be 3D, and thus make it possible to reduce the dislocation density in the layer 3b, and make it possible to obtain an even thicker useful layer.

Second Intermediate Layer of $B_wAl_xGa_yIn_zN$ where $w+x+y+z=1$ and $0.5 < x \leq 1$, $0 \leq y < 1$ and $0 \leq w$ and $z < 1$ As illustrated in FIG. 4, on the layer 3b having the composition $B_wAl_xGa_yIn_zN$, where $w+x+y+z=1$ and $0 \leq x < 0.5$, $0 < y \leq 1$ and $0 \leq w$ and $z < 1$, a second intermediate layer 4b having the composition $B_wAl_xGa_yIn_zN$, where $w+x+y+z=1$ and $0.5 < x \leq 1$, $0 \leq y < 1$ and $0 \leq w$ and $z < 1$ (the coefficients w, x, y and z optionally being different from those of the first intermediate layer 4a, or the same), is formed.

As for the first intermediate layer 4a, this second intermediate layer 4b grows in a relaxed manner.

The thickness of this intermediate layer 4b is between 10 and 50 nm.

For an intermediate layer having a binary composition (AlN), the thickness is preferentially 15 to 17 nm.

For an intermediate layer having the composition $Al_{0.8}Ga_{0.2}N$, the thickness is preferentially 25 nm.

At least one of the first intermediate layer 4a with a high aluminium content, the layer 3b with a low aluminium content and the second intermediate layer 4b with a high aluminium content is a III-N alloy comprising at least aluminium and gallium, or, if applicable, indium and/or boron.

Useful Layer of GaN

The crack-free useful layer 3 of GaN is then formed on the second intermediate layer.

The useful layer may be n-doped, for example, with silicon.

If applicable, the dopant concentration may be uniform throughout the thickness of the useful layer or may vary gradually or abruptly.

The useful layer 3 may thus consist of two layers 3', 3" of GaN having different doping levels.

In this way, to form a Schottky diode, the useful layer 3 should comprise a layer 3" of n− GaN on a so-called "buried" layer 3' of n+ or n++ GaN.

The transition between the two doping levels may be abrupt at the interface between the two layers 3', 3", or gradual over a thickness of some tens to hundreds of nanometers.

While the dopant and/or free carrier concentration in the layer 3 of GaN remains less than $10^{18}$ cm$^{-3}$, the thickening of the useful layer 3 of 1 µm gives rise to an increase in the tensile strain by 0.1 GPa or more.

Figure 8:
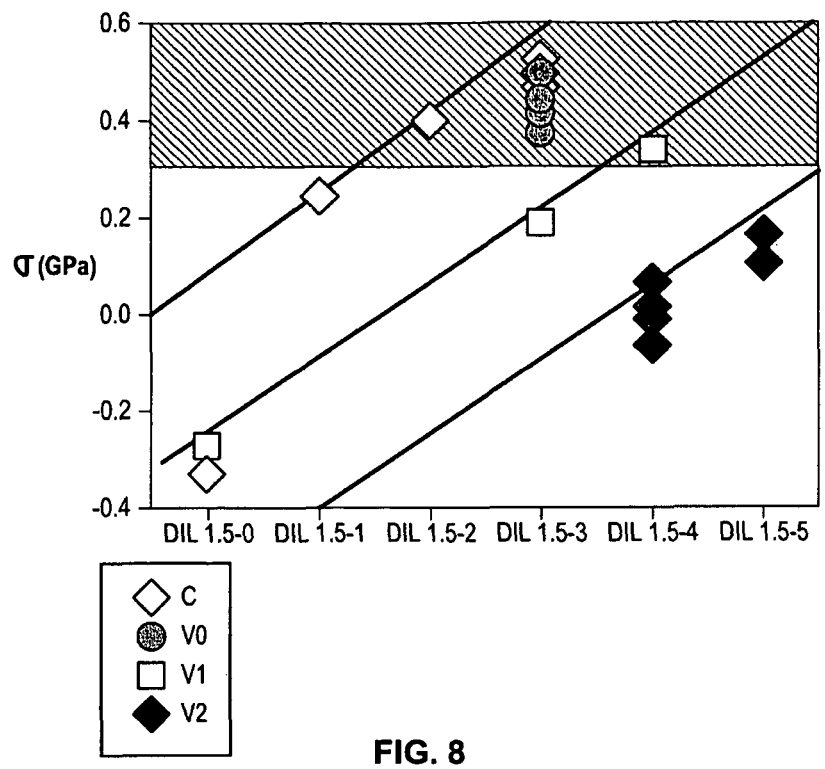
FIG. 8 is a graph illustrating the progression of strain in the useful layer of GaN in various structures according to the nature of the intermediate layers between the buffer layer and the useful layer.

FIG. 8 illustrates the progression of the strain as a function of the thickness of the useful layer in a structure comprising two intermediate layers, as a function of the nature of the layers formed between the buffer layer and the useful layer.

The x-axis of this graph contains various thicknesses of the useful layer, which may consist of a single layer of 1.5 micrometers of n+ doped GaN (structure referenced DIL 1.5-0) or a layer of 1.5 micrometers of n+ doped GaN and a layer of n− doped GaN (structure references DIL 1.5-x, where x is the thickness of n− doped GaN).

The table below shows the main features of the various structures C, V0, V1 and V2 appearing in FIG. 8.

| Structure | Structure C (binary) | ALTERNATIVE EMBODIMENTS 0 (V0) (1 ternary) | ALTERNATIVE EMBODIMENT 1 (V1) (1 ternary) | ALTERNATIVE EMBODIMENT 2 (V2) (2 ternary) |
|---|---|---|---|---|
| Layer 3″ | n− GaN | n− GaN | n− GaN | n− GaN | n− GaN |
| Layer 3′ | n+ GaN | n+ GaN | n+ GaN | n+ GaN | n+ GaN |
| System 3c | — | — | $Al_{0.1}GaN$ | — | $Al_{0.1}GaN$ |
| Layer 4b | AlN | AlN | AlN | $Al_{0.8}GaN$ | $Al_{0.8}GaN$ |
| Layer 3b | GaN | $Al_{0.1}GaN$ | GaN | GaN | GaN |
| Layer 4a | AlN | AlN | AlN | AlN | AlN |
| Layer 3a | 3D GaN | 3D GaN | 3D GaN | 3D GaN | 3D GaN |
| Mask | SiN | SiN | SiN | SiN | SiN |
| Buffer layer 2 | AlN | AlN | AlN | AlN | AlN |
| Substrate 1 | Si(111) | Si(111) | Si(111) | Si(111) | Si(111) |

The y-axis represents the strain in the useful layer; a positive strain consisting of tensile strain, a negative strain of compressive strain.

Above a tensile strain of +0.3 GPa, the samples are cracked (hatched area).

In this graph only conveying the experimental results for a given buffer structure, it is observed that an increase in the thickness of GaN of 1 μm gives rise to an increase in the tension of +0.1 GPa.

Moreover, doping GaN with silicon gives rise to additional tensile strain.

In this respect, reference may be made to the publications by A. Krost, A. Dadgar, G. Straβburger, R. Clos, "GaN-based epitaxy on silicon: Stress measurements," Phys. Stat. Sol. A 200, 26 (2003); and A. Dadgar, P. Veit, F. Schulze, J. Bläsing, A. Krtschil, H. Witte, A. Diez, T. Hempel, J. Christen, R. Clos, A. Krost, "MOVPE growth of GaN on silicon: Substrates and strain," Thin Solid Films 515, 4356 (2007).

As a result, an increase of 0.5 μm in the $n^+$ or $n^{++}$ GaN layer gives rise to the same increase in the tensile strain as that generated by an increase of 1 μm in an n− GaN layer.

According to the level of doping of the layer—or combination of layers—of GaN, different crack-free thicknesses may be achieved, the greater thicknesses (up to 9 μm) being achieved for non-doped GaN layers.

The table below shows some types of useful layers suitable for being obtained using the invention, these layers or combinations of layers being equivalent in terms of the tensile strain generated.

| Useful layer structure | Layer of $n^+$ or $n^{++}$ GaN | Layer of $n^-$ GaN |
|---|---|---|
| $n^{++}$ GaN | Thickness: 4 μm<br>Dopant: Si<br>$n = 5 \times 10^{18}$ cm$^{-3}$ | — |
| $n^+$ GaN | Thickness: 5 μm<br>Dopant: Si<br>$n = 4 \times 10^{18}$ cm$^{-3}$ | — |
| $n^{++}$ GaN/$n^-$ GaN | Thickness: 1.5 μm<br>Dopant: Si<br>$n = 5 \times 10^{18}$ cm$^{-3}$ | Thickness: 5 μm<br>Dopant: Si<br>$n < 10^{18}$ cm$^{-3}$ |
| $n^+$ GaN/$n^-$ GaN | Thickness: 2 μm<br>Dopant: Si<br>$n = 4 \times 10^{18}$ cm$^{-3}$ | Thickness: 5 μm<br>Dopant: Si<br>$n < 10^{18}$ cm$^{-3}$ |
| $n^-$ GaN | — | Thickness: 9 μm<br>Dopant: Si<br>$n < 10^{18}$ cm$^{-3}$ |

In order to obtain even greater crack-free thicknesses of GaN, it will be possible to grow, on the second intermediate layer 4b, a third layer of $B_wAl_xGa_yIn_zN$, where $w+x+y+z=1$ and $0 \leq x < 0.5$, $0 < y \leq 1$ and $0 \leq w$ and $z < 1$ followed by a third intermediate layer of $B_wAl_xGa_yIn_zN$, where $w+x+y+z=1$ and $0.5 < x \leq 1$, $0 \leq y < 1$ and $0 \leq w$ and $z < 1$, and optionally repeat this operation.

Roughness measurements were made on thick layers of GaN obtained using the method described above.

These measurements demonstrate the surface of the useful layer of GaN is very smooth (rms roughness less than 1 nm on 10×10 μm²) and characterized by atomic steps.

Moreover, this surface has an emerging dislocation density of 3 to $4 \times 10^8$ cm$^{-2}$ which is extremely low for an epitaxial GaN-on-silicon system.

The useful layer of GaN is thus suitable for producing electronic, optoelectronic or micromechanical devices with excellent performances.

Examples of devices are described in detail hereinafter.

Moreover, a structure wherein at least two layers with a high aluminium content and two layers with a low aluminium content are inserted between the substrate and the useful layer—for example, as in FIG. 4, two layers of AlN 4a, 4b (in addition to the buffer layer 2) and two layers of GaN 3a, 3b are inserted between the silicon substrate 1 and the useful layer 3 of GaN—suitable for reducing the tensile strain in the useful layer and having a low deflection.

Transition Layers of $B_wAl_xGa_yIn_zN$, where $w+x+y+z=1$ and $0 \leq x < 0.5$, $0 < y \leq 1$ and $0 \leq w$ and $z < 1$ In one particular embodiment of the invention, illustrated in FIG. 5, between the second intermediate layer 4b (or, if applicable, an $n^{th}$ intermediate layer) and the useful layer 3 of GaN, a system 3c of transition layers is grown.

These transition layers are particularly useful for growing a very thick layer of GaN (i.e., greater than 6 μm) and/or with a very low dislocation density and/or with high n type doping.

These transition layers are typically at least three in number and have a composition having the formula $B_wAl_xGa_yIn_zN$, where $w+x+y+z=1$ and $0 \leq 0.5$, $0 < y \leq 1$ and $0 \leq w$ and $z < 1$.

The aluminium content of each of the layers may be uniform throughout the thickness of the layer, or vary gradually.

The composition of each of the transition layers may be different to that of the adjacent transition layer, or identical with different doping.

In this way, merely for illustrative purposes, a system of four layers 3c1, 3c2, 3c3, 3c4 is grown, the layers respectively having the following features, from the second intermediate layer 4b to the useful layer 3 of GaN:

- a first transition layer 3c1 having a thickness between 0 and 1 μm, preferably between 50 and 500 nm and more preferably approximately 250 nm in thickness where x is less than 0.5, preferentially between 0.05 and 0.3; this layer may be doped with silicon wherein $n<10^{18}$ cm$^{-3}$;
- a second transition layer 3c2 having a thickness between 0 and 1 μm, preferably between 200 and 1000 nm and more preferably approximately 750 nm in thickness where x is preferentially between 0.05 and 0.3; this layer may be doped gradually with silicon, with a maximum of up to $n<10^{19}$ cm$^{-3}$ at the top point of the layer;
- a third transition layer 3c3 having a thickness between 0 and 1 μm, preferably between 10 and 100 nm and more preferably approximately 50 nm in thickness where x is preferentially between 0.05 and 0.3; this layer may optionally be doped with silicon where $n<10^{19}$ cm$^{-3}$;
- a fourth transition layer 3c4 having a thickness between 0 and 1 μm, preferably between 20 and 500 nm and more preferably approximately 300 nm in thickness where x decreases gradually from the second intermediate layer to the useful layer of GaN, where x is between 0.05 and 0.3 at the interface with the third transition layer and tending toward 0 at the interface with the useful layer of GaN; moreover, this layer may be doped with silicon where $n<10^{19}$ cm$^{-3}$.

In particular, if the target device requires epitaxy of a buried layer 3' of n+GaN, these transition layers 3c are optionally n-doped by means of any dopant (typically: Si, Ge and/or O).

The doping may be uniform throughout the thickness of each layer or gradual.

Indeed, it was observed that gradual doping produced superior results in terms of quality of the useful layer.

Indeed, gradual doping makes it possible to prevent the formation of interfaces inside the doped layer.

Interfaces are potential dislocation formation sites.

Since the transition layers 3c are intended to induce compressive strain in the useful layer 3, and GaN with unintentional or low doping grows under tensile strain on GaN with high n+ doping, preventing the generation of dislocations in the transition layers 3c makes it possible to prevent relaxation of the layer of GaN with high n+ doping and thus retain the compressive strain in this layer and in the GaN with unintentional or low doping.

The doping profile is advantageously as follows:
- the first transition layer 3c1 is n-doped with a doping level less than $10^{18}$ cm$^{-3}$;
- the second transition layer 3c2 is n-doped with an increasing gradual doping level from the first layer 3c1 to the third transition layer 3c3, up to a doping level less than $10^{19}$ cm$^{-3}$ at the interface with the third transition layer 3c3;
- the third transition layer 3c3 is n-doped with a doping level less than $10^{19}$ cm$^{-3}$;
- the fourth transition layer 3c4 is n-doped with a doping level less than $10^{19}$ cm$^{-3}$.

Figure 9:
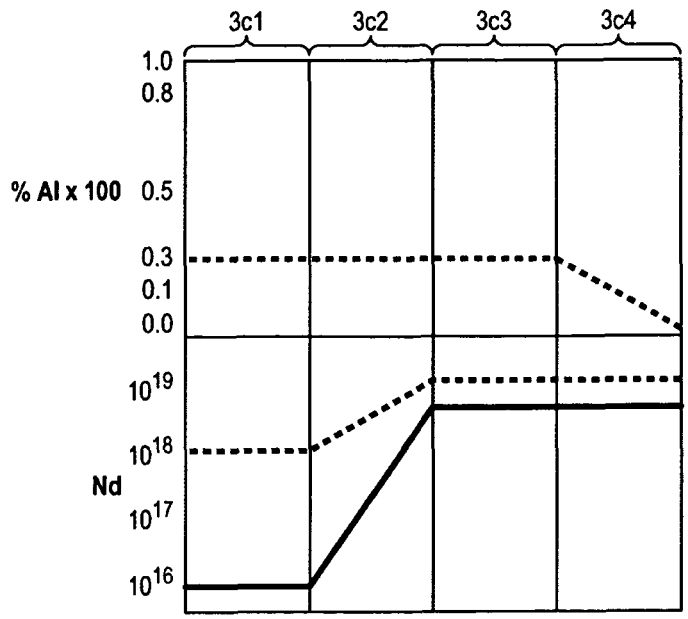
FIG. 9 shows the aluminium and dopant profiles in a system of transition layers according to the invention.

FIG. 9 illustrates aluminium (curve (a)) and silicon concentration (curve (b)) profiles in the four transition layers 3c1 to 3c4, the lowest x-value corresponding to the interface with the second intermediate layer 4b.

Effect of the Layer of at Least Ternary III-N Alloy

The formation, in the present invention, of a structure comprising at least one underlying layer, an intermediate layer with a high aluminium content and an overlying layer (optionally being the useful layer or a further layer with a low aluminium content) is suitable for relaxing the strain in the intermediate layer at the growth temperature of the layer and, if at least one of these three layers consists of an at least ternary III-N alloy comprising aluminium and gallium, applying in the underlying layer and in the useful layer greater compressive strain than when the structure only comprises layers formed from binary alloys such as AlN and GaN.

Two strain relaxation mechanisms in the intermediate layer have been identified and are described hereinafter.

Relaxation of Strains in the Intermediate Layer at Growth Temperature by Forming Voids Under the Interface Between the Intermediate Layer and an Underlying Layer An analysis of the final structure demonstrates the presence of voids having a specific shape and density with respect to a structure only containing binary III-N alloys such as AlN and GaN.

Voids are known defects in semiconductor material processing, consisting of microcavities formed in the material.

Figure 10:
FIGS. 10 to 12 are Nomarski contrast optical microscopic views of various structures.

FIG. 10 is a Nomarski contrast optical microscopic surface view of a structure that, unlike the invention, only consists of binary layers of AlN and GaN. Indeed, the substrate comprises a substrate 1 of Si(111), a layer 2 of AlN, a layer 3a of GaN, a layer 4a of AlN, a layer 3b of GaN, a layer 4b of AlN and a useful layer 3 of GaN (see FIG. 3).

A dense network of inclusions is observed therein, which, when observed with a scanning electron microscope (SEM) or a transmission electron microscope (TEM) in a cross-section, are shown to be voids situated under the AlN-on-GaN interfaces, in the layers of GaN.

These two networks of voids appear to be identical in respect of the size and density of the cavities formed.

When replacing, as in the structure in FIG. 10, one or a plurality of binary layers by one or a plurality of ternary layers (AlGaN) (or quaternary or quinary layers), and/or by inserting one or a plurality of ternary (or quaternary or quinary) layers, rarefaction of the voids under the interface between the intermediate layer and the underlying layer is observed.

Figure 11:
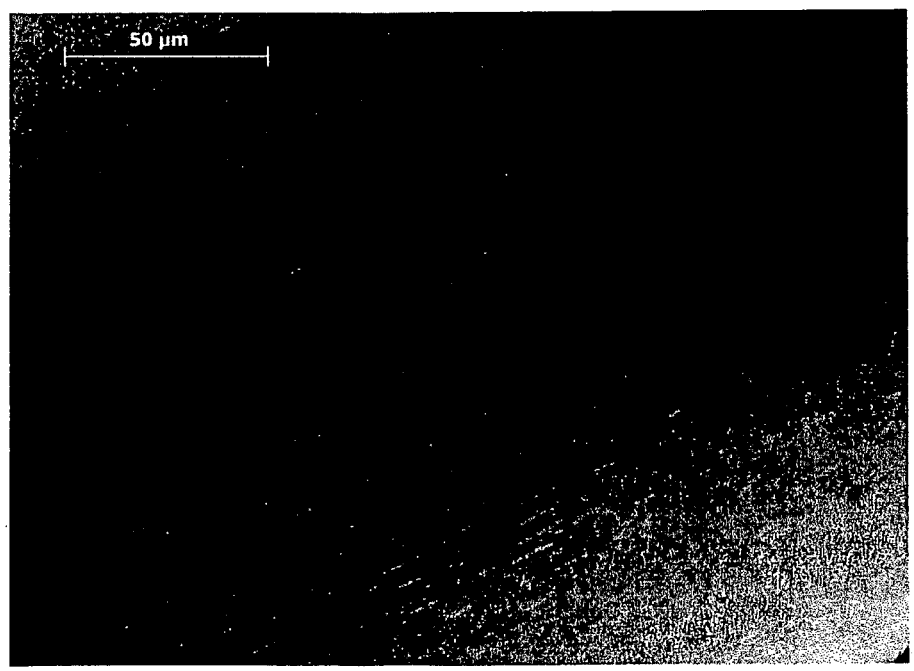

FIG. 11 thus illustrates a Nomarski contrast optical microscopic surface view of a structure which, unlike that in FIG. 10, comprises a layer 4b (see FIG. 3) of AlGaN instead of the second intermediate layer of AlN.

Dense and short voids are still detected under the interface between the first intermediate layer 4a (made of AlN) and the underlying layer 3a of GaN, but the voids present under the interface between the second ternary intermediate layer 4b and the underlying layer of GaN 3b are more spaced out and longer.

Figure 12:
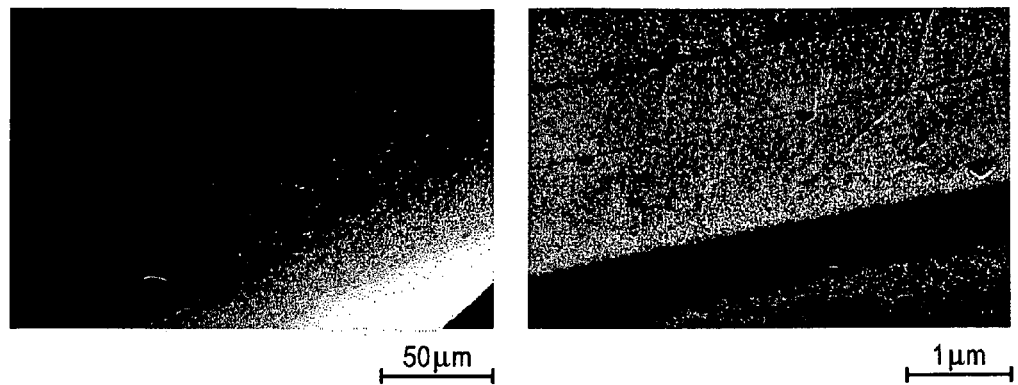

FIG. 12 is a Nomarski contrast optical microscopic surface view of a structure wherein, unlike that in FIG. 10, transition layers 3c of AlGaN with a low aluminium content (x being of the order of 0.1) have been inserted between the second intermediate layer 4b and the useful layer 3 (see FIG. 5).

Dense and short voids are still observed under the interface between the first intermediate layer 4a (made of AlN) and the underlying layer 3a of GaN, but the voids present under the interface between the second intermediate layer 4b and the underlying layer 3b of GaN are more spaced out and longer.

The assumption is made, as in the article by J. M. Bethoux, P. Vennégués, F. Natali, E. Feltin, O. Tottereau, G. Nataf, P. de Mierry, F. Semond, "Growth of high quality crack-free AlGaN films on GaN templates using plastic relaxation through buried cracks," J. Appl. Phys. 94, 6499 (2003), and in the doctoral thesis by J. M. Bethoux, "Relaxation des contraintes dans les hétérostructures épaisses (Al,Ga)N: une piste originale pour la réalisation de diodes électroluminescentes á cavité resonante," University of Nice—Sophia Antipolis, Sep. 24 (2004), that the intermediate layer and the underlying layer are cracked in-situ during epitaxy, while relaxing the tensile strain in the intermediate layer, and subsequently healing, again during epitaxy, the voids being residues of the cracks in the underlying layer.

Moreover, the studies cited in the previous paragraph demonstrate that the voids can serve as an anchoring point for horizontal dislocations (a-type) in the underlying layer.

Void generation thus has dual benefits: while relaxing the strain in the intermediate layer, they would help reduce the dislocations propagating in the material.

Figure 3:
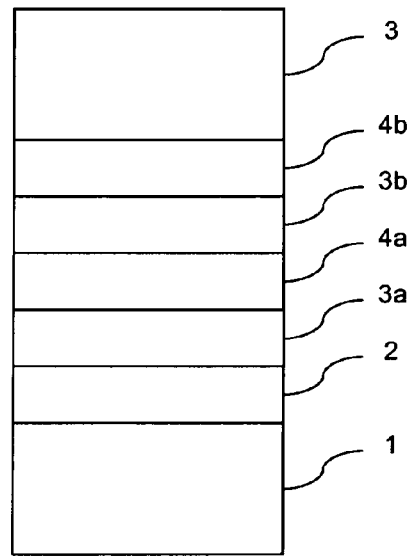
FIG. 3 is a cross-sectional diagram of a known structure successively comprising a silicon substrate, a buffer layer of AlN, two alternations of a layer of GaN and an intermediate layer of AlN, and a useful layer of GaN.
Figure 13:
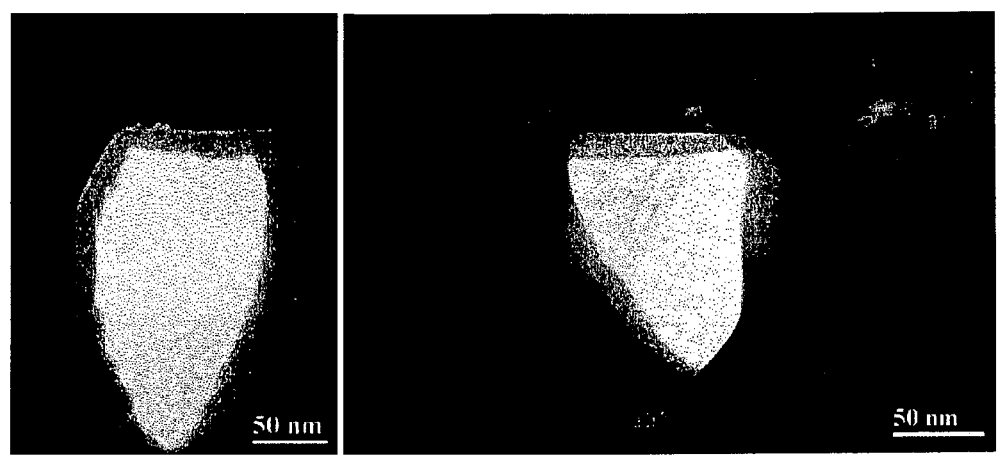
FIG. 13 shows TEM images of the voids in the structure in FIG. 11.

FIG. 13 shows TEM images of the voids in the structure in FIG. 12, the photograph on the left corresponding to the interface between the first intermediate layer 4a and the underlying layer 3a of GaN; the photograph on the left corresponding to the interface between the second intermediate layer 4b and the underlying layer 3b of GaN (see FIG. 3).

No difference is observed between the cavities themselves, but horizontal dislocations are seen in the GaN, which must come from the cavity.

The experimental conditions favoring this strain relaxation mechanism appear to be more in-depth cleaning of the epitaxial reactor between two epitaxy sequences (involving annealing, scrubbing and scraping of the reactor components) and/or starting epitaxy of the buffer layer in an $H_2$ and $NH_3$ stream.

Relaxation of Strains in the Intermediate Layer at Growth Temperature by Forming V-Shaped Defects in the Interface Between an Intermediate Layer and an Underlying Layer According to a further mechanism, the growth of an intermediate layer on an underlying layer results in the formation of V-shaped defects (referred to as "V-shapes" or "V-pits") in the intermediate layer.

Such defects are described in the article by P. Vennégués, Z. Bougrioua, J. M. Bethoux, M. Azize, O. Tottereau, Relaxation mechanisms in MOVPE grown Al rich (Al,Ga)N/GaN hetero-structures, J. Appl. Phys. 97, 4912 (2005).

The presence of these V-shaped defects gives rise to horizontal (i.e., a-type) dislocation nucleation in the interface between the intermediate layer and the underlying layer.

This results in a relaxation of the strains of the intermediate layer by the a-type dislocations.

During the growth of the intermediate layer, these V-shaped defects are progressively healed by filling and/or by lateral growth.

Figure 2:
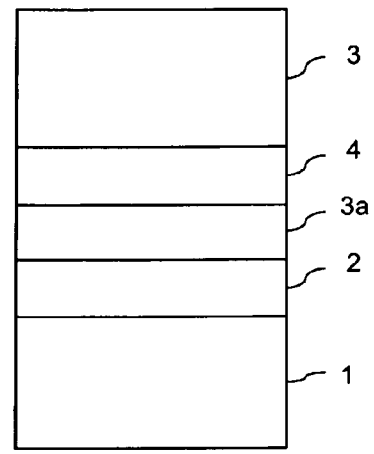
FIG. 2 is a cross-sectional diagram of a known structure successively comprising a silicon substrate, a buffer layer of AlN, a first layer of GaN, an intermediate layer of AlN and a useful layer of GaN.
Figure 14:
FIG. 14 shows TEM images of the V-shaped defects in a similar structure to that in FIG. 2.

FIG. 14 shows a photograph taken with a transmission electron microscope of the interface between an intermediate layer 4 of AlN and an underlying layer 3a of GaN (in a structure such as that illustrated in FIG. 2), wherein the V-shaped defects in the interface are represented by arrows.

The experimental conditions favoring this second strain relaxation mechanism appear to consist of less in-depth cleaning of the epitaxial reactor between two epitaxy sequences (only involving annealing but no scrubbing or scraping of the reactor components) and/or starting epitaxy of the buffer layer with an $N_2$ and Al flow.

Due to the relaxation of the strains of the intermediate layer following either of the two mechanisms described above, a compressive strain is applied in the overlying layer.

Since the plastic relaxation of the $BAl_bGaInN$-on-$BAl_a$-$GaInN$ system (where b>a) is not a linear function of the difference $\Delta x = b-a$ (but accelerating where $\Delta x$ approaches 1), the compressive strain applied on the overlying layer increases if at least one of the intermediate layer and the overlying layer is an at least ternary III-N alloy comprising aluminium and gallium.

Replacing a binary layer by a ternary layer in a structure comprising an intermediate layer and overlying layer may enable a gain of up to −0.2 GPa in compressive strain in the overlying layer.

Each −0.1 GPa gain in compressive strain in the useful layer at the epitaxial temperature gives rise to an increase of approximately 1 μm in the thickness of the crack-free useful layer, when the useful layer has low or no n doping.

When the useful layer has high n+ doping, the increase in the thickness of the crack-free layer is of the order of 0.5 μm, due to the additional tensile strain generated in the useful layer by doping.

Examples of Structures

Alternative Embodiment 0

A first example of a structure with a dual intermediate layer (see FIG. 4) successively comprises a silicon substrate 1, a 200 nm thick buffer layer 2 of AlN, a 1.3 μm 3D layer 3a of GaN, a 17 nm first intermediate layer 4a of AlN, a 1 μm layer 3b of $Al_{0.1}Ga_{0.9}N$, a 17 nm second intermediate layer 4b of AlN, a 1.5 μm layer 3' of n+ doped GaN and a 2 μm layer 3" of n− doped GaN (i.e., a 3.5 μm thick useful layer 3).

Alternative Embodiment 1

A second example of a structure with a dual intermediate layer (see FIG. 4) successively comprises a silicon substrate 1, a 200 nm thick buffer layer 2 of AlN, a 1.3 μm 3D layer 3a of GaN, a 17 nm first intermediate layer 4a of AlN, a 1 μm layer 3b of GaN, a 25 nm second intermediate layer 4b of $Al_{0.8}Ga_{0.2}N$, a 1.5 μm layer 3' of n+ doped GaN and a 3 μm layer 3" of n-doped GaN (i.e., a 4.5 μm thick useful layer 3).

Alternative Embodiment 2

A third example of a structure with a dual intermediate layer (see FIG. 5) successively comprises a silicon substrate 1, a 200 nm thick buffer layer 2 of AlN, a 1.3 μm 3D layer 3a of GaN, a 17 nm first intermediate layer 4a of AlN, a 1 μm layer 3b of GaN, a 25 nm second intermediate layer 4b of $Al_{0.8}Ga_{0.2}N$, a system 3c of four transition layers and a 2 μm layer 3' of n+ doped GaN and a 4 μm layer 3" of n− doped GaN (i.e., a 6 μm thick useful layer 3).

For this purpose, the transition layers of $Al_xGa_{1-x}N$ advantageously have an aluminium content x between 0.08 and 0.12.

For example, the system 3c of transition layers consists successively of a layer 3c1 of 250 nm of unintentionally doped $Al_{0.1}Ga_{0.9}N$, a layer 3c2 of 750 nm of $Al_{0.1}Ga_{0.9}N$ with gradual n→n+ doping, a layer 3c3 of 50 nm of n+ doped $Al_{0.1}Ga_{0.9}N+$, and a layer 3c4 of 300 nm of n+ doped AlGaN and having a decreasing aluminium content from 0.1 to 0.

In order to form, by means of epitaxy, a 2 μm thick layer 3' of n+ doped GaN and a 5 μm thick layer 3" of n− GaN (i.e., a 6 μm thick useful layer 3), the transition layers of $Al_xGa_{1-x}N$ preferentially have an aluminium content x between 0.2 and 0.3.

Alternative Embodiment 3

A fourth example of a structure with a dual intermediate layer is identical to that in the previous example, excluding the 1 μm layer 3b of GaN situated between the two intermediate layers 4a, 4b, which is in this case replaced by a ternary layer 3b of $Al_{0.1}Ga_{0.9}N$.

Alternative Embodiment 4

Finally, a fifth alternative embodiment is identical to that in the previous example, excluding the first intermediate layer 4a which is in this case replaced by a layer 4a of 25 nm of $Al_{0.8}Ga_{0.2}N$.

Devices

Some, non-limiting, examples of electronic, optoelectronic or micromechanical devices suitable for being manufactured using the structure according to the invention will now be described.

Schottky Diode

Figure 15:
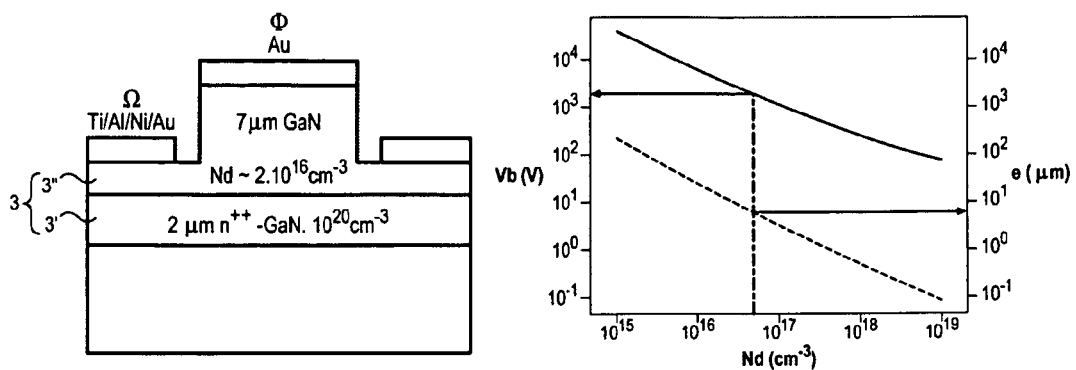
FIG. 15 is a cross-sectional view of a Schottky diode produced from a structure according to the invention.

FIG. 15 illustrates, in the left portion thereof, a Schottky diode produced in the useful layer 3 of GaN formed by means of the invention.

The right portion of FIG. 15 illustrates the determination of the thickness e of a layer of n-doped GaN required to withstand reverse field conditions (breakdown voltage Vb between $10^2$ and $10^4$ V) as a function of the doping level Nd thereof.

The useful layer 3 comprises a buried layer 3' for ohmic contact and an overlying layer 3" for Schottky contact.

The layer 3' is made of n++ doped GaN, the dopant concentration being of the order of $10^{20}$ cm$^{-3}$ and is 2 μm thick. Such a layer has a low resistance of the order of 50 Ohm/cm$^2$.

The layer 3" is made of GaN with low n– doping, the dopant concentration being of the order of $2 \cdot 10^{16}$ cm$^{-3}$, and is 7 μm thick. The layer 3" withstands a breakdown voltage of the order of 600 V.

The total thickness of the useful layer 3 is thus 9 μm.

The acute requirements applied by a III-N Schottky diode on the epitaxial structure supporting the same require the epitaxy of a system of III-N buffer layers suitable for the epitaxy of extremely thick continuous layers of GaN on a silicon substrate.

Such crack-free layers were obtained by reducing the GaN dislocation density to a very low level compared to the results obtained with other groups by means of the epitaxy of III-N materials on a silicon substrate.

The quality of the material obtained is superior to that of epitaxial GaN on sapphire (the sapphire substrate being the reference industrial substrate at the present time).

Indeed, the thick epitaxial layer of GaN on silicon is devoid of "micropipe" defects, unlike an epitaxial layer of GaN on sapphire.

Naturally, the low dislocation density obtained by means of the invention can be used for any electronic, optoelectronic or micromechanical device, even if it requires a thinner useful layer.

In this way, the implementation of the invention is also advantageous for the manufacture of light-emitting diodes, laser diodes, transistors (HFETs, HEMTs), etc.

For the various devices illustrated and described below, only the active layer 3 and the specific layers for the device in question formed on the active layer have been represented; the underlying structure of the active layer 3, including a silicon substrate, being as described above.

Light-Emitting Diode

For light-emitting diodes, the low cost and large size of a silicon substrate makes it possible, compared to substrates such as sapphire, SiC or bulk GaN, to lower the cost of the end component, which achieving, by means of the invention, a crystalline quality in terms of dislocation density not previously possible using a sapphire substrate, i.e., a dislocation density that is 10 times lower than the density obtained in the prior art with the growth of GaN on silicon. This makes it possible to reduce non-radiative recombinations and thus obtain a superior internal and external quantum yield.

Figure 16:
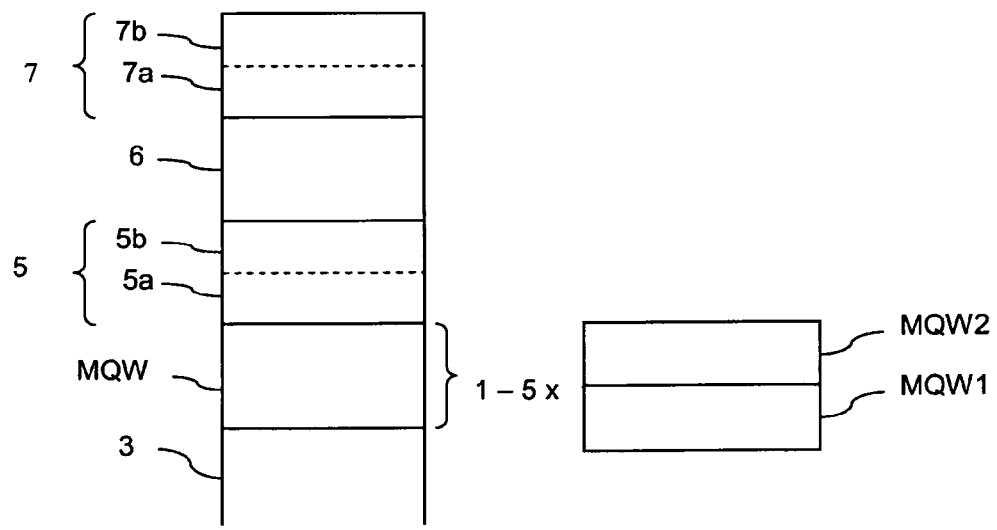
FIG. 16 illustrates an example of a light-emitting diode emitting in the visible range.

FIG. 16 illustrates an example of a light-emitting diode emitting in the visible range.

To produce such a diode, on a 2 μm thick active layer 3 of GaN n+ doped with silicon, a multiple quantum well MQW having the composition GaN/Ga$_{1-x}$In$_x$N, a layer 5 consisting of a layer 5b of 10 nm of Al$_x$Ga$_{1-x}$N (where x is between 0.1 and 0.3) p-doped with magnesium on a layer 5a of 10 nm of Al$_x$Ga$_{1-x}$N (where x is between 0.1 and 0.3), a layer 6 of 200 nm of GaN or GaInN p-doped with magnesium and a layer 7 consisting of a layer 7b of 5 nm of GaN or GaInN p++ doped with magnesium on a layer 7a of 5 nm of GaN or GaInN p+ doped with magnesium are successively formed.

The multiple quantum well MQW consists of a stack of 1 to 5 dual-layer structures consisting of a layer MQW2 of 8 nm of GaN on a layer MQW1 of 3 nm of Ga$_{1-x}$In$_x$N (where x is between 0.05 and a value greater than 0.3 while remaining less than 1).

Figure 17:
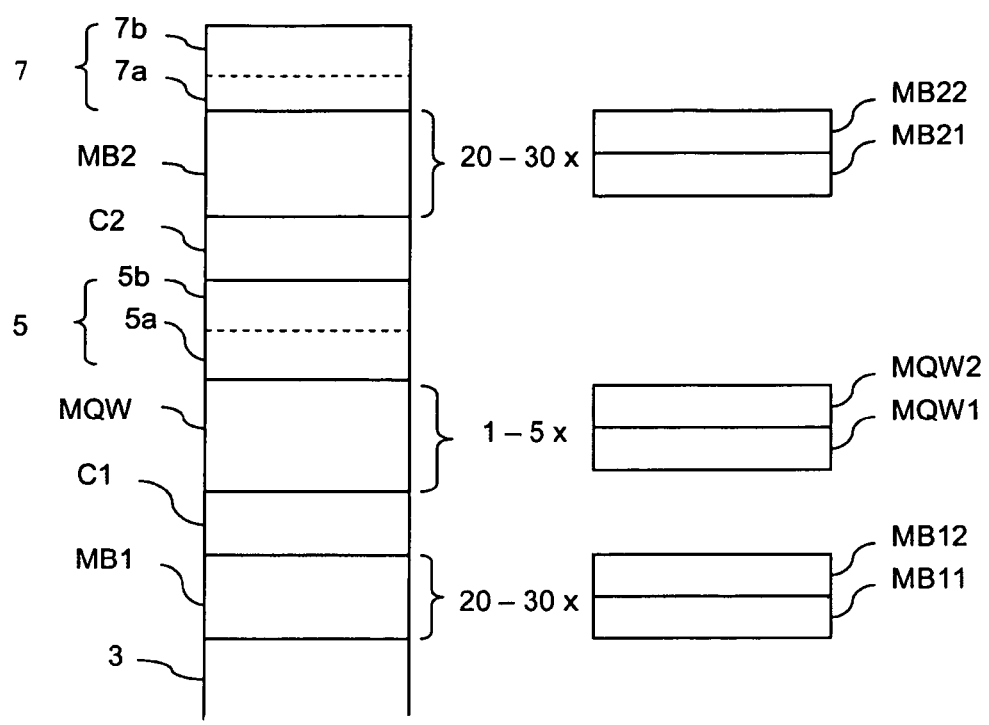
FIG. 17 illustrates an example of a resonant cavity light-emitting diode with two monolithic Bragg mirrors.

FIG. 17 illustrates an example of a resonant cavity light-emitting diode with two monolithic Bragg mirrors.

Such a diode successively comprises, on an active layer 3 of GaN n+ doped with silicon, a first Bragg mirror MB1 having the composition GaN/Al$_x$Ga$_{1-x}$N n-doped with silicon, a first cavity C1 of GaN n-doped with silicon, a multiple quantum well MQW having the composition GaN/Ga$_{1-x}$In$_x$N, a layer 5 consisting of a layer 5b of 10 nm of Al$_x$Ga$_{1-x}$N (where x is between 0.1 and 0.3) p-doped with magnesium on a layer 5a of 10 nm of Al$_x$Ga$_{1-x}$N (where x is between 0.1 and 0.3), a second cavity C2 of GaN p-doped with magnesium, a second Bragg mirror MB2 having the composition GaN/Al$_x$Ga$_{1-x}$N p-doped with magnesium and a layer 7 consisting of a layer 7b of 5 nm of GaN or GaInN p++ doped with magnesium on a layer 7a of 5 nm of GaN or GaInN p+ doped with magnesium.

The multiple quantum well MQW consists of a stack of 1 to 5 dual-layer structures consisting of a layer MQW2 of 11.5 nm of GaN on a layer MQW1 of 2.5 nm of Ga$_{1-x}$In$_x$N (where x is between 0.05 and a value greater than 0.3 while remaining less than 1).

The first Bragg mirror MB1 consists of a stack of 20 to 30 dual-layer structures consisting of a layer MB12 of 60 nm of Al$_{0.2}$Ga$_{0.8}$N doped with silicon on a layer MB11 of 55 nm of GaN doped with silicon.

Finally, the second Bragg mirror MB2 consists of a stack of 20 to 30 dual-layer structures consisting of a layer MB22 of 60 nm of Al$_{0.2}$Ga$_{0.8}$N doped with magnesium on a layer MB21 of 55 of GaN doped with magnesium.

Figure 18:
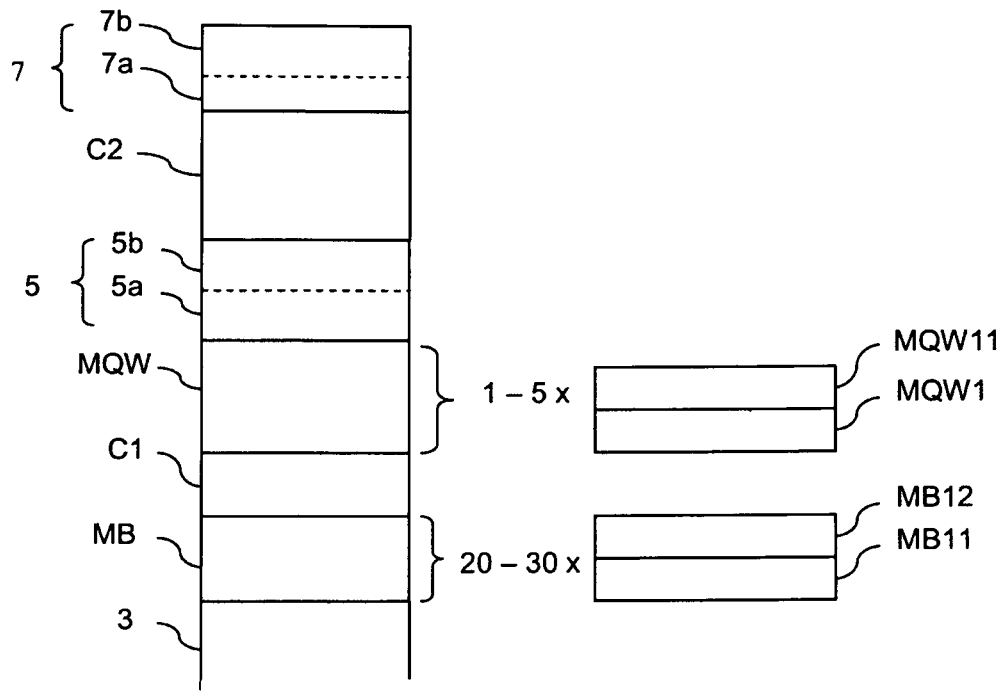
FIG. 18 illustrates an example of a resonant cavity light-emitting diode with one monolithic Bragg mirror.

FIG. 18 illustrates an example of a resonant cavity light-emitting diode with one monolithic Bragg mirror.

Such a diode successively comprises, on an active layer 3 of GaN n+ doped with silicon (also forming an n contact layer), a Bragg mirror MB having the composition GaN/Al$_x$Ga$_{1-x}$N n-doped with silicon, a first cavity C1 of GaN n-doped with silicon, a multiple quantum well MQW having the composition GaN/Ga$_{1-x}$In$_x$N (forming the active zone of the device), an electron blocking layer 5 consisting of a layer 5b of 10 nm of Al$_x$Ga$_{1-x}$N (where x is between 0.1 and 0.3) p-doped with magnesium on a layer 5a of 10 nm of Al$_x$Ga$_{1-x}$N (where x is between 0.1 and 0.3), a second cavity C2 of GaN p-doped with magnesium and a p contact layer 7 consisting of a layer 7b of 5 nm of GaN or GaInN p++ doped with magnesium on a layer 7a of 5 nm of GaN or GaInN p+ doped with magnesium.

The composition of the multiple quantum well MQW and the Bragg mirror MB is identical, respectively, to that of the multiple quantum well MQW and the first Bragg mirror MB1 of the device illustrated in FIG. 17.

Figure 19:
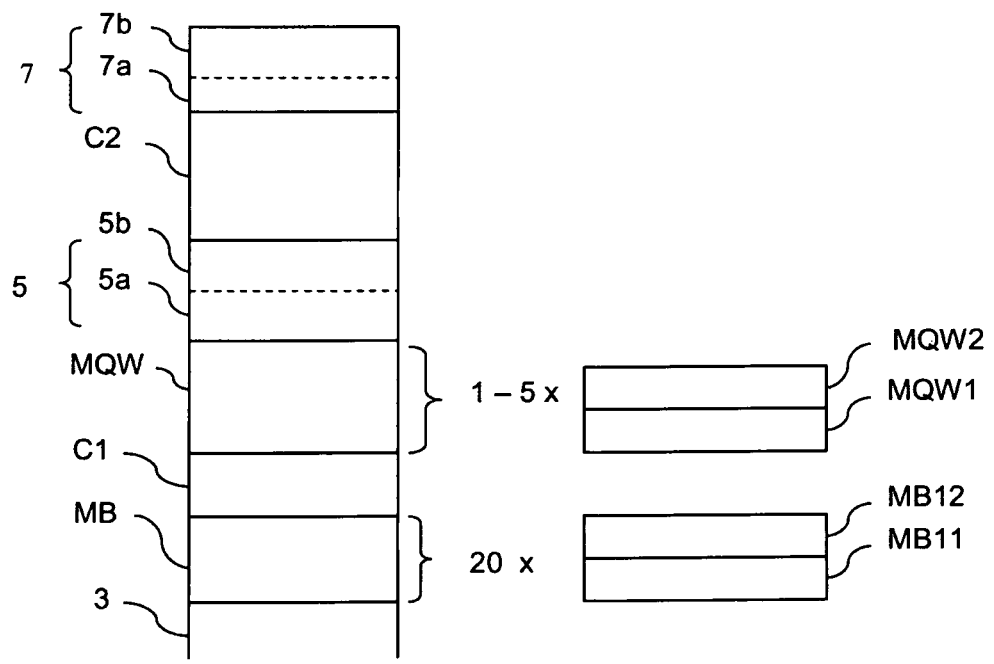
FIG. 19 illustrates an example of an RC-LED with a monolithic Bragg mirror based on (Al, In)N.

FIG. 19 illustrates an example of an RC-LED with a monolithic Bragg mirror based on AlInN.

This device successively comprises, on an active layer 3 of GaN n+ doped with silicon, a Bragg mirror MB having the composition GaN/Al$_x$Ga$_{1-x}$N n-doped with silicon, a first cavity C1 of GaN n-doped with silicon, a multiple quantum well MQW having the composition GaN/Ga$_{1-x}$In$_x$N (forming the active zone of the device), an electron blocking layer 5 consisting of a layer 5b of 10 nm of Al$_x$Ga$_{1-x}$N (where x is between 0.1 and 0.3) p-doped with magnesium on a layer 5a of 10 nm of Al$_x$Ga$_{1-x}$N (where x is between 0.1 and 0.3), a second cavity C2 of GaN p-doped with magnesium and a p contact layer 7 consisting of a layer 7b of 5 nm of GaN or GaInN p++ doped with magnesium on a layer 7a of 5 nm of GaN or GaInN p+ doped with magnesium.

The multiple quantum well MQW consists of a stack of 1 to 5 dual-layer structures consisting of a layer MQW2 of 11.5 nm of GaN on a layer MQW1 of 2.5 nm of Ga$_{1-x}$In$_x$N (where x is between 0.05 and a value greater than 0.3 while remaining less than 1).

The Bragg mirror MB consists of a stack of 20 dual-layer structures consisting of a layer MB12 of 62 nm of Al$_{0.83}$In$_{0.17}$N doped with silicon on a layer MB11 of 55 nm of GaN doped with silicon.

Laser Diode

For laser diodes, the low cost and large size of a silicon substrate makes it possible, compared to substrates such as sapphire, SiC or bulk GaN, to lower the cost of the end component, which achieving, by means of the invention, a crystalline quality in terms of dislocation density not previously possible using a sapphire substrate, i.e., a dislocation density that is 10 times lower than the density obtained in the prior art with the growth of GaN on silicon. This makes it possible to reduce non-radiative recombinations and thus obtain a lower threshold current intensity.

Figure 20:
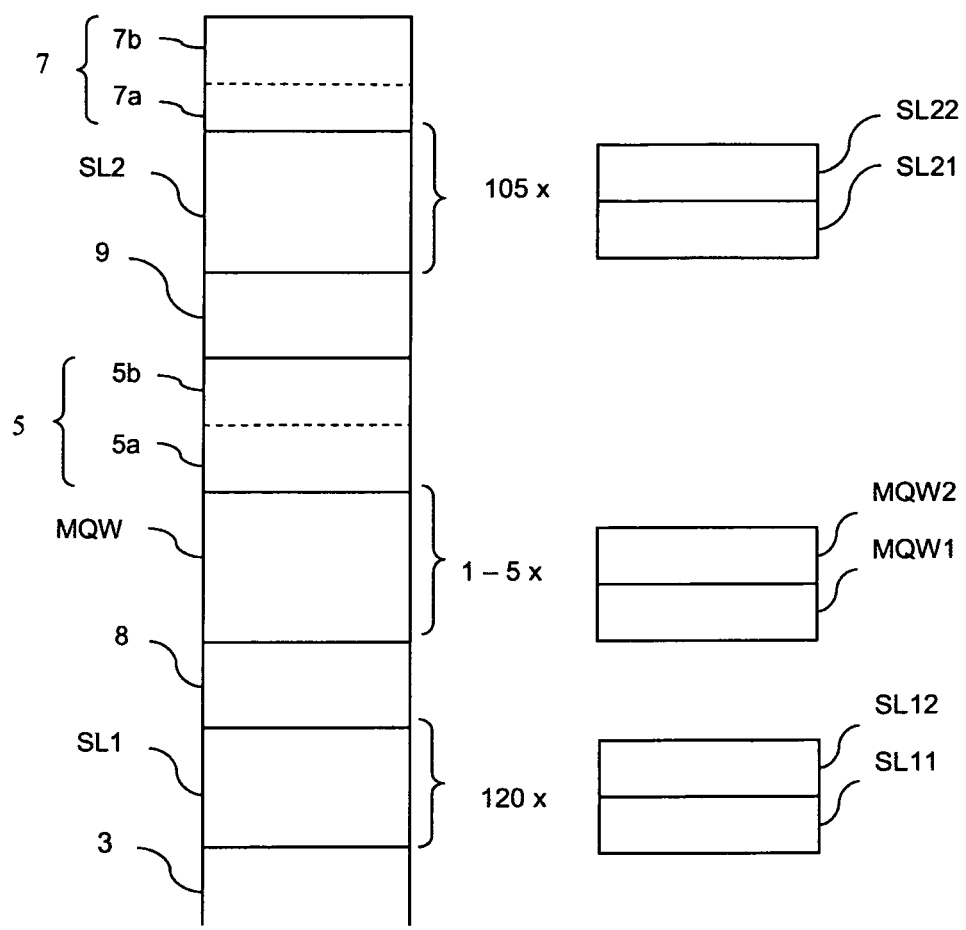
FIG. 20 illustrates a first example of a laser diode.

FIG. 20 illustrates a first example of an "edge emitting" laser diode.

This device successively comprises, on an active layer 3 of 4 μm of GaN n+ doped with silicon (forming the n contact layer), a first superlattice SL1 (forming the n coating) having the composition GaN/Al$_x$Ga$_{1-x}$N n-doped with silicon, a layer 8 of 110 nm of GaN n-doped with silicon (forming the n waveguide), a multiple quantum well MQW having the composition GaN/Ga$_x$In$_{1-x}$N (active zone of the device), an electron blocking layer 5 consisting of a layer 5b of 10 nm of Al$_x$Ga$_{1-x}$N (where x is between 0.1 and 0.3) p-doped with magnesium on a layer 5a of 10 nm of Al$_x$Ga$_{1-x}$N (where x is between 0.1 and 0.3), a layer 9 of 100 nm of GaN p-doped with magnesium (forming the p waveguide), a second superlattice SL2 (forming the p coating) having the composition GaN/Al$_x$Ga$_{1-x}$N p-doped with magnesium and a p contact layer 7 consisting of a layer 7b of 5 nm of GaN or GaInN p++ doped with magnesium on a layer 7a of 5 nm of GaN or GaInN p+ doped with magnesium.

The multiple quantum well MQW consists of a stack of 1 to 5 dual-layer structures consisting of a layer MQW2 of 10 nm of GaN on a layer MQW1 of 3 nm of Ga$_{0.15}$In$_{0.85}$N.

The first superlattice SL1 consists of a stack of 120 dual-layer structures consisting of a layer SL12 of 2.5 nm of Al$_{0.83}$In$_{0.17}$N doped with silicon on a layer SL11 of 10 nm of Al$_{0.1}$Ga$_{0.9}$N.

The second superlattice SL2 consists of a stack of 105 dual-layer structures consisting of a layer SL22 of 2.5 nm of GaN doped with magnesium on a layer SL21 of 2.5 nm of Al$_{0.14}$Ga$_{0.86}$N.

Figure 21:
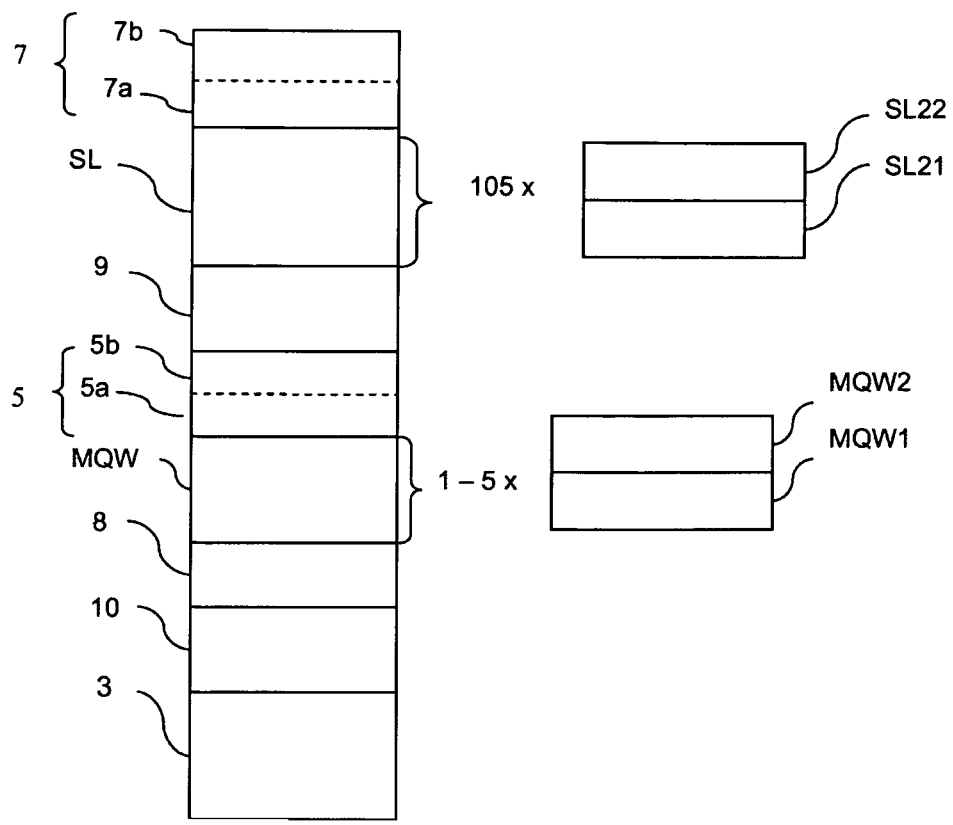
FIG. 21 illustrates a second example of a laser diode, based on (Al, In)N.

FIG. 21 illustrates a second example of a laser diode of the same type as in the previous example but based on AlInN, such as those described in the articles by H. P. D. Schenk, M. Nemoz, M. Korytov, P. Vennégués, A. D. Dräger, A. Hangleiter, "Indium incorporation dynamics into AlIInN ternary alloys for laser structures lattice matched to GaN," Appl. Phys. Lett. 93, 081116 (2008), and H. P. D. Schenk, M. Nemoz, M. Korytov, P. Vennégués, P. Demolon, A. D. Dräger, A. Hangleiter, R. Charash, P. P. Maaskant, B. Corbett, J. Y. Duboz, "AlIInN optical confinement layers for edge emitting group III-nitride laser structures," Phys. Stat. Sol. C 6, S897 (2009).

This device successively comprises, on an active layer 3 of 4 μm of GaN n+ doped with silicon (forming the n contact layer), a layer 10 (forming the n coating) having the composition Al$_{0.83}$In$_{0.17}$N n-doped with silicon, a layer 8 of 110 nm of GaN n-doped with silicon (forming the n waveguide), a multiple quantum well MQW having the composition GaN/Ga$_x$In$_{1-x}$N (active zone of the device), an electron blocking layer 5 consisting of a layer 5b of 10 nm of Al$_x$Ga$_{1-x}$N (where x is between 0.1 and 0.3) p-doped with magnesium on a layer 5a of 10 nm of Al$_x$Ga$_{1-x}$N (where x is between 0.1 and 0.3), a layer 9 of 100 nm of GaN p-doped with magnesium (forming the p waveguide), a superlattice SL (forming the p coating) having the composition GaN/Al$_x$Ga$_{1-x}$N p-doped with magnesium and a p contact layer 7 consisting of a layer 7b of 5 nm of GaN or GaInN p++ doped with magnesium on a layer 7a of 5 nm of GaN or GaInN p+ doped with magnesium.

The multiple quantum well MQW consists of a stack of 1 to 5 dual-layer structures consisting of a layer MQW2 of 10 nm of GaN on a layer MQW1 of 3 nm of Ga$_{0.15}$In$_{0.85}$N.

The superlattice SL consists of a stack of 105 dual-layer structures consisting of a layer SL22 of 2.5 nm of GaN doped with magnesium on a layer SL21 of 2.5 nm of Al$_{0.14}$Ga$_{0.86}$N.

Transistor

For transistors, the low cost and large size of a silicon substrate makes it possible, compared to substrates such as sapphire, SiC or bulk GaN, to lower the cost of the end component, which achieving, by means of the invention, a crystalline quality in terms of dislocation density not previously possible using a sapphire substrate, i.e., a dislocation density that is 10 times lower than the density obtained in the prior art with the growth of GaN on silicon. This makes it possible to increase the service life of the transistor and reduce dislocation-induced electron scattering, providing higher mobilities. Moreover, due to the superior heat conduction thereof, a silicon substrate enables a smaller component size compared to the design of a transistor on a sapphire substrate, hence a superior substrate yield.

Figure 22:
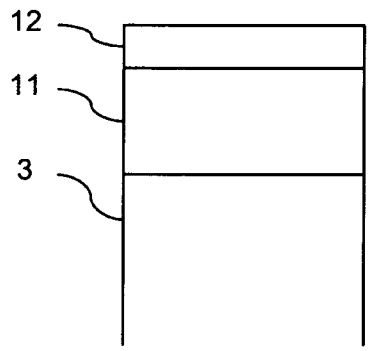
FIG. 22 illustrates an example of a high electron mobility transistor (HEMT) or a field effect transistor (FET)

FIG. 22 illustrates an example of a high electron mobility transistor (HEMT) or a field effect transistor (FET).

In this transistor, the buffer layer is formed by the active layer 3 of GaN. On the buffer layer, a channel layer 11 of 30 nm of Al$_{0.25}$Ga$_{0.75}$N, covered with a layer 12 of 3 nm of GaN, is formed.

Figure 23:
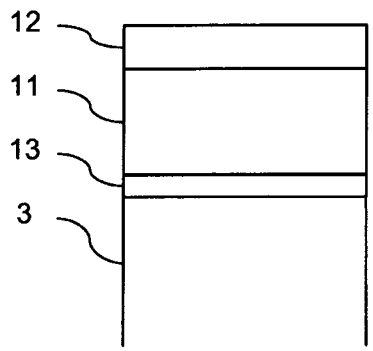
FIG. 23 illustrates another example of a high electron mobility transistor (HEMT) or a field effect transistor (FET), comprising a "spacer" layer.

FIG. 23 illustrates a further example of a high electron mobility transistor (HEMT) or field effect transistor (FET), similar to that in FIG. 22 but comprising, between the buffer layer 3 and the channel layer 11, a spacer layer 13 of 1 nm of AlN.

Due to this thin layer of AlN between the GaN and the AlGaN, the band gap at the interface is greater than at a GaN/AlGaN interface. Consequently, the penetration in the AlGaN of the electron wave function is lower, and the two-dimensional electron gas spontaneously forming at the GaN/AlN/AlGaN interface (piezoelectric effect) is better confined. Moreover, the layer of AlN is thin enough not to form further resistance in series.

Alternatively (not shown), a high electron mobility transistor (HEMT) or field effect transistor (FET) similar to that in FIG. 23 may comprise, on the buffer layer 3, a spacer layer 13 of 1 to 2 nm of AlN, a channel layer 11 of 10 to 30 nm of Al$_{0.82}$In$_{0.18}$N and a layer 12 of 3 nm of GaN.

The method according to the invention may also be suitable for forming, in or on the crack-free useful layer of GaN, transistors such as those described by the articles by A. Dadgar, M. Neuburger, F. Schulze, J. Bläsing, A. Krtschil, I. Daumiller, M. Kunze, K.-M. Günther, H. Witte, A. Diez, E. Kohn, A. Krost, "High-current AlInN/GaN field effect transistors," Phys. Stat. Sol. A 202, 832 (2005), or by M. Gonschorek, J.-F. Carlin, E. Feltin, M. A. Py, N. Grandjean, "High electron mobility lattice-matched AlInN/GaN field-effect transistor heterostructures," Appl. Phys. Lett. 89, 062106 (2006).

Obviously, the examples given above are merely particular illustrations that are in no way limiting in terms of the fields of application of the invention or the materials used in the device manufactured in or on the useful layer.

In this way, the invention is suitable for obtaining self-supporting layers of GaN, i.e., suitable for being removed from the substrate whereon they were grown epitaxially, without needing to be attached to a stiffener.

Such thick layers of GaN of high crystalline quality are suitable for use as large GaN substrates, or for manufacturing semiconductor structures by means of layer transfer methods, particularly including the use of the SMARTCUT® process.

Alternatively, the useful layer of GaN obtained according to the invention can be transferred onto a substrate wherein the properties are chosen according to the target application.

Figure 24:
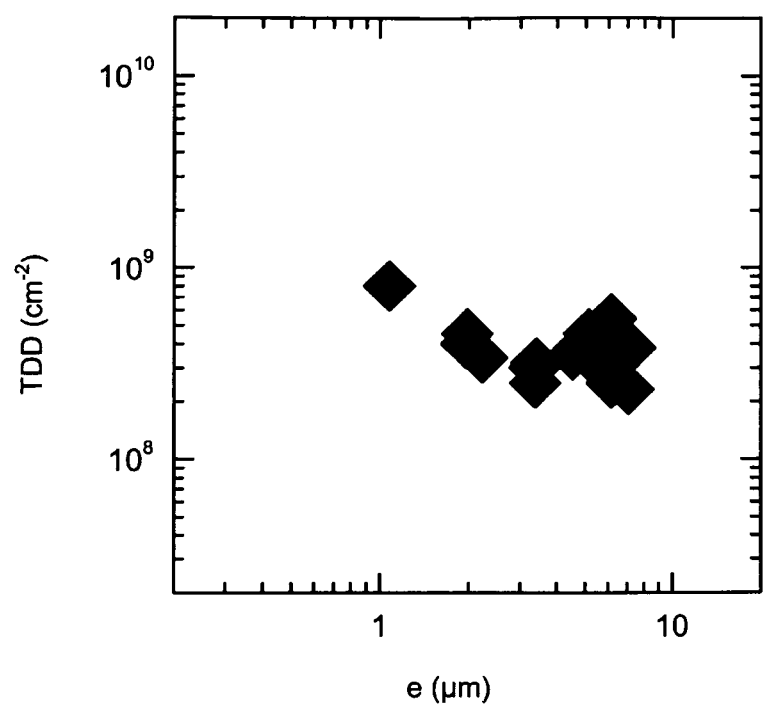
FIG. 24 is a graph showing the dislocation density as a function of the thickness of the useful layer of GaN.

FIG. 24 shows the dislocation density TDD (in $cm^{-2}$) as a function of the thickness e of the useful layer of GaN (in μm) for structures formed according to the invention.

This figure shows that structures obtained by means of the method according to the invention mostly have a dislocation density less than or equal to $5 \times 10^8$ $cm^{-2}$, particularly when the thickness of the layer of GaN exceeds 1 micrometer in thickness.

The invention claimed is:

1. A method for manufacturing, by means of epitaxy, a monocrystalline useful GaN layer on a substrate, the coefficient of thermal expansion of the substrate being less than the coefficient of thermal expansion of GaN such that the substrate is suitable for generating tensile strain in the useful GaN layer, the method comprising the following successive steps:
    (a) forming an AlN buffer layer on the substrate;
    (b) three-dimensionally epitaxially growing, directly on the AlN buffer layer, a GaN layer that is relaxed at the epitaxial temperature;
    (c1) epitaxially growing on the GaN layer a first intermediate layer having the composition $B_wAl_xGa_yIn_zN$, where $w+x+y+z=1$ and $0.5<x\leq1$, $0\leq y<1$, $0\leq w<1$ and $0\leq z<1$;
    (c2) epitaxially growing a layer having the composition $B_wAl_xGa_yIn_zN$, where $w+x+y+z=1$ and $0\leq x<0.5$, $0\leq y<1$, $0\leq w<1$ and $0\leq z<1$;
    (c3) epitaxially growing a second intermediate layer having the composition $B_wAl_xGa_yIn_zN$, where $w+x+y+z=1$ and $0.5<x\leq1$, $0\leq y<1$, $0\leq w<1$ and $0\leq z<1$,
    at least one of the layers formed in steps (c1) to (c3) being an at least ternary III-N alloy comprising aluminium and gallium;
    (d) epitaxially growing the useful GaN layer.

2. The method of claim 1, wherein the diameter of the substrate is greater than or equal to 150 mm.

3. The method of claim 1, wherein step (d) comprises epitaxially growing the useful GaN layer to a thickness of at least 5 μm.

4. The method of claim 1, wherein the first intermediate layer and the second intermediate layer have a thicknesses between 10 nm and 50 nm, and wherein the $B_wAl_xGa_yIn_zN$ layer formed between the first intermediate layer and the second intermediate layer has a thickness between 0.5 μm and 2 μm.

5. The method of claim 1, wherein the aluminium contents of the first intermediate layer and the second intermediate layer are between 0.8 and 1 and the aluminium content of the $B_wAl_xGa_yIn_zN$ layer formed between the first intermediate layer and the second intermediate layer is between 0 and 0.2.

6. The method of claim 1, further comprising, between steps (c3) and (d), the following successive steps:
    (c4) forming a first transition layer having the composition $B_wAl_xGa_yIn_zN$, where $w+x+y+z=1$ and $0\leq x<0.5$, $0\leq y<1$, $0\leq w<1$ and $0\leq z<1$, with a dopant concentration less than $10^{18}$ $cm^{-3}$;
    (c5) forming a second transition layer having the composition $B_wAl_xGa_yIn_zN$, where $w+x+y+z=1$ and $0\leq x<0.5$, $0\leq y<1$, $0\leq w<1$ and $0\leq z<1$, with a dopant concentration not more than $10^{19}$ $cm^{-3}$;
    (c6) forming a third transition layer having the composition $B_wAl_xGa_yIn_zN$, where $w+x+y+z=1$ and $0\leq x<0.5$, $0\leq y<1$, $0\leq w<1$ and $0\leq z<1$, with a dopant concentration less than $10^{19}$ $cm^{-3}$;
    (c7) forming a fourth transition layer having the composition $B_wAl_xGa_yIn_zN$, where $w+x+y+z=1$ and $0\leq x<0.5$, $0\leq y<1$, $0<w<1$ and $0\leq z<1$, with x gradually decreasing to 0 and a dopant concentration less than $10^{19}$ $cm^{-3}$.

7. The method of claim 1, wherein the method comprises a metalorganic vapour phase epitaxy (MOVPE) process.

8. The method of claim 1, wherein the substrate is selected from the following substrates: Si(111), Si(110), Si(100), porous Si, silicon-on-polycrystalline SiC (SopSiC), 4H-SiC, 6H-SiC, 3C-SiC/Si(111), and silicon-on-insulator (SOI).

9. The method of claim 8, wherein the substrate is a silicon substrate doped with boron such that the resistivity of the substrate is less than 5 mΩ·cm.

10. The method of claim 9, wherein the silicon substrate is doped with nitrogen.

11. The method of claim 1, further comprising transferring the useful GaN layer to another substrate.

12. The method of claim 3, further comprising removing the useful GaN layer to form a self-supporting layer of GaN.

* * * * *

UNITED STATES PATENT AND TRADEMARK OFFICE
CERTIFICATE OF CORRECTION

PATENT NO.         : 9,093,271 B2                                    Page 1 of 1
APPLICATION NO.    : 14/129638
DATED              : July 28, 2015
INVENTOR(S)        : Schenk et al.

It is certified that error appears in the above-identified patent and that said Letters Patent is hereby corrected as shown below:

In the claims:
CLAIM 6, COLUMN 26, LINE 23, change "$B_wAl_xGa_yIn_zN$," to --$B_wAl_xGa_yIn_zN$,--
CLAIM 6, COLUMN 26, LINE 31, change "$B_wAl_xGa_yIn_zN$," to --$B_wAl_xGa_yIn_zN$,--
CLAIM 6, COLUMN 26, LINE 36, change "$0 \leq y < 1, 0 < w < 1$" to --$0 \leq y < 1, 0 \leq w < 1$--

Signed and Sealed this
First Day of March, 2016

Michelle K. Lee
*Director of the United States Patent and Trademark Office*